(12) United States Patent
Kim et al.

(10) Patent No.: US 12,167,639 B2
(45) Date of Patent: Dec. 10, 2024

(54) DISPLAY DEVICE WITH REPAIR CIRCUIT FOR REPAIRING A DEFECTIVE PIXEL

(71) Applicant: Samsung Display Co., LTD., Yongin-si (KR)

(72) Inventors: Jee Hoon Kim, Cheonan-si (KR); Shin Hyuk Yang, Seongnam-si (KR); Hui Won Yang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 395 days.

(21) Appl. No.: 17/592,965

(22) Filed: Feb. 4, 2022

(65) Prior Publication Data

US 2022/0320216 A1 Oct. 6, 2022

(30) Foreign Application Priority Data

Apr. 1, 2021 (KR) ........................ 10-2021-0042789

(51) Int. Cl.
*H10K 59/121* (2023.01)
*H10K 59/131* (2023.01)
*H10K 59/35* (2023.01)

(52) U.S. Cl.
CPC ....... *H10K 59/1213* (2023.02); *H10K 59/131* (2023.02); *H10K 59/353* (2023.02)

(58) Field of Classification Search
CPC ........ H10K 50/10; H10K 50/30; H10K 50/81; H10K 50/816; H10K 50/82; H10K 50/826; H10K 59/00; H10K 59/12; H10K 59/1213; H10K 59/123; H10K 59/131; H10K 59/353; H10K 59/8051; H10K 59/8052; H10K 59/88; H10K 71/861; G09G 3/006; G09G 2330/08; G09G 2330/10; G09G 2330/12

See application file for complete search history.

(56) References Cited

U.S. PATENT DOCUMENTS

2020/0066817 A1* 2/2020 Kim ..................... H10K 59/123

FOREIGN PATENT DOCUMENTS

| KR | 10-2016-0024274 | 3/2016 |
| KR | 10-2016-0083532 | 7/2016 |
| KR | 10-2061796 | 1/2020 |
| KR | 10-2020-0029226 | 3/2020 |

* cited by examiner

*Primary Examiner* — Cheung Lee
(74) *Attorney, Agent, or Firm* — KILE PARK REED & HOUTTEMAN PLLC

(57) ABSTRACT

A display device comprises a repair circuit, and a repair circuit connection pattern extending across a pixel and the repair circuit. Each of a first and second subpixels comprises a light emitting element, a first transistor connected thereto, and a second transistor connected to a gate electrode of the first transistor. The repair circuit comprises first and second repair transistors connected to a gate electrode of the first repair transistor. A first source/drain electrode of the first transistor of each of the first and second subpixels is connected to the power line, a second source/drain electrode of the first transistor of each of the first and second subpixels overlaps the repair circuit connection pattern. A first source/drain electrode of the first repair transistor is connected to the power line, and a second source/drain electrode of the first repair transistor overlaps the first repair circuit connection pattern.

20 Claims, 21 Drawing Sheets

DISPLAY DEVICE WITH REPAIR CIRCUIT FOR REPAIRING A DEFECTIVE PIXEL

CROSS-REFERENCE TO RELATED APPLICATION(S)

This application claims priority to and benefits of Korean Patent Application No. 10-2021-0042789 under 35 U.S.C. § 119(a), filed on Apr. 1, 2021, in the Korean Intellectual Property Office, the entire contents of which is incorporated herein by reference.

BACKGROUND

1. Technical Field

The disclosure relates to a display device.

2. Description of the Related Art

As information society develops, demands for display devices for displaying images is increasing in various forms. For example, display devices are being applied to various electronic devices such as smartphones, digital cameras, notebook computers, navigation devices, and smart televisions.

Display devices include light-receiving display devices such as liquid crystal display devices, field emission display devices, and light emitting display devices such as organic light emitting display devices including organic light emitting elements, inorganic light emitting display devices including inorganic light emitting elements such as inorganic semiconductors, and micro-light emitting display devices including micro-light emitting elements.

An organic light emitting display device may include a thin-film transistor, wirings connected to the thin-film transistor, and an organic electroluminescent element that may be driven by the thin-film transistor and may realize an image. Since various wirings connected to the thin-film transistor may be formed to have fine line widths, an open defect in which some of the wirings may not be properly formed during a manufacturing process may occur.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device and a method of repairing the display device, in which a defective pixel (or subpixel) can be repaired, thereby improving yield and reducing process cost.

However, aspects of the disclosure are not restricted to the above. The above and other aspects of the disclosure will become more apparent to one of ordinary skill in the art to which the disclosure pertains by referencing the detailed description of the disclosure given below.

According to an embodiment of the disclosure, a display device may include at least one pixel including a first subpixel and a second subpixel that emit light of different colors, and a power line electrically connected to the first subpixel and the second subpixel and applying a power supply voltage to each of the first subpixel and the second subpixel, at least one repair circuit disposed adjacent to the at least one pixel, and a first repair circuit connection pattern extending across the at least one pixel and the at least one repair circuit. Each of the first subpixel and the second subpixel may include a light emitting element, a first transistor electrically connected to the light emitting element, and a second transistor electrically connected to a gate electrode of the first transistor. The at least one repair circuit may include a first repair transistor and a second repair transistor electrically connected to a gate electrode of the first repair transistor. A first source or drain electrode of the first transistor of each of the first subpixel and the second subpixel may be electrically connected to the power line, a second source or drain electrode of the first transistor of each of the first subpixel and the second subpixel may overlap the first repair circuit connection pattern. A first source or drain electrode of the first repair transistor may be electrically connected to the power line, and a second source or drain electrode of the first repair transistor may overlap the first repair circuit connection pattern.

The light emitting element may include an anode, a light emitting layer, and a cathode that may be stacked sequentially. The first source or drain electrode and the second source or drain electrode of the first transistor and the first source or drain electrode and the second source or drain electrode of the first repair transistor may form a first conductive layer. The first repair circuit connection pattern and the anode of the light emitting element may form a second conductive layer different from the first conductive layer.

The display device may further include a via layer on the first conductive layer. The via layer may be disposed between the first conductive layer and the second conductive layer.

The via layer may include a first recess pattern and a second recess pattern defined by removing at least a part of the via layer in a thickness direction. The first recess pattern may be disposed in an area in which the second source or drain electrode of the first transistor of each of the first subpixel and the second subpixel overlaps the first repair circuit connection pattern. The second recess pattern may be disposed in an area in which the second source or drain electrode of the first repair transistor of the at least one repair circuit overlaps the first repair circuit connection pattern.

At least a part of the first repair circuit connection pattern may be disposed in at least one of the first recess pattern and the second recess pattern.

The first power line may form a third conductive layer different from the first conductive layer and the second conductive layer, and the third conductive layer may be disposed under the first conductive layer and the second conductive layer.

The display device may further include a fourth conductive layer different from the first conductive layer, the second conductive layer and the third conductive layer. The fourth conductive layer may include gate electrodes of the first transistor and the second transistor of each of the first subpixel and the second subpixel, and gate electrodes of the first repair transistor and the second repair transistor.

In an area in which the second source or drain electrode of the first transistor of each of the first subpixel and the second subpixel overlaps the first repair circuit connection pattern, at least one insulating layer may be at least partially disposed between the second source or drain electrode of the first transistor of each of the first subpixel and the second subpixel and the first repair circuit connection pattern. The second source or drain electrode of the first transistor of each of the first subpixel and the second subpixel may be electrically isolated from the first repair circuit connection pattern.

The display device may further include a first data line and a second data line that may be adjacent to each other and extend in a same direction, and a second repair circuit connection pattern extending across the first data line and the second data line and overlapping the first data line and the second data line. The second transistor of the first subpixel may be electrically connected to the first data line, the second transistor of the second subpixel may be electrically connected to the second data line. The second repair transistor may be electrically connected to the second repair circuit connection pattern.

The first data line, the second data line and the power line may form a first conductive layer. The second repair circuit connection pattern, the first source or drain electrode and the second source or drain electrode of the first transistor and the first source or drain electrode and the second source or drain electrode of the first repair transistor may form a second conductive layer different from the first conductive layer.

The display device may further include an insulating layer between the first conductive layer and the second conductive layer the insulating layer including a first recess pattern and a second recess pattern that may be defined by removing at least a part of the insulating layer. The first recess pattern may be disposed in an area in which the second repair circuit connection pattern overlaps the first data line, and the second recess pattern may be disposed in an area in which the second repair circuit connection pattern overlaps the second data line.

The insulating layer may include a buffer layer and an interlayer insulating layer that may be stacked sequentially.

The at least one pixel may be provided in plural, the at least one repair circuit may be provided in plural. Each of the plurality of repair circuits may be disposed between adjacent ones of the plurality of pixels. The adjacent ones of the plurality of pixels may be symmetrical to each other.

The display device may further include a display area displaying an image and a non-display area disposed adjacent to the display area. The pixels and the repair circuits may be disposed in the display area.

According to an embodiment of the disclosure, a display device may include a pixel include a first subpixel and a second subpixel that emit light of different colors, and a power line electrically connected to at least one of the first subpixel and the second subpixel, a repair circuit disposed adjacent to the pixel and include a first repair transistor, and a second repair transistor electrically connected to a gate electrode of the first repair transistor, and a first repair circuit connection pattern extending across the pixel and the repair circuit. The first subpixel including a first transistor electrically connected to a first light emitting element, and a second transistor electrically connected to a gate electrode of the first transistor. The second subpixel including a second light emitting element different from the first light emitting element. A first source or drain electrode of the first transistor of the first subpixel may be electrically connected to the power line, a second source or drain electrode of the first transistor of the first subpixel may overlap and may be electrically isolated from the first repair circuit connection pattern. A first source or drain electrode of the first repair transistor may be electrically connected to the power line, and a second source or drain electrode of the first repair transistor may overlap the first repair circuit connection pattern. The second source or drain electrode of the first repair transistor may be electrically connected to the first repair circuit connection pattern in an area overlapping the first repair circuit connection pattern.

Each of the first light emitting element and the second light emitting element may include an anode, a light emitting layer, and a cathode that may be stacked sequentially. The first source or drain electrode and the second source or drain electrode of the first transistor and the first source or drain electrode and the second source or drain electrode of the first repair transistor may form a first conductive layer. The first repair circuit connection pattern and the anode of each of the first light emitting element and the second light emitting element may form a second conductive layer different from the first conductive layer.

The display device may further include a first data line and a second data line that may be adjacent to each other and extend in a same direction, and a second repair circuit connection pattern overlapping the first data line and the second data line and electrically connected to the second repair transistor. The second repair circuit connection pattern may be electrically isolated from the first data line and may be electrically connected to the second data line in an area overlapping the second data line.

The first data line, the second data line and the power line may form a first conductive layer. The second repair circuit connection pattern, the first source or drain electrode and the second source or drain electrode of the first transistor, the first source or drain electrode and the second source or drain electrode of the first repair transistor, and a first source or drain electrode and a second source or drain electrode of the second repair transistor may form a second conductive layer different from the first conductive layer.

In an area in which the first repair circuit connection pattern overlaps the second source or drain electrode of the first repair transistor, the second source or drain electrode of the first repair transistor may be electrically connected to the first repair circuit connection pattern by welding.

The second subpixel may further include a first transistor electrically connected to the second light emitting element and electrically isolated from the power line.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

Figure 1:
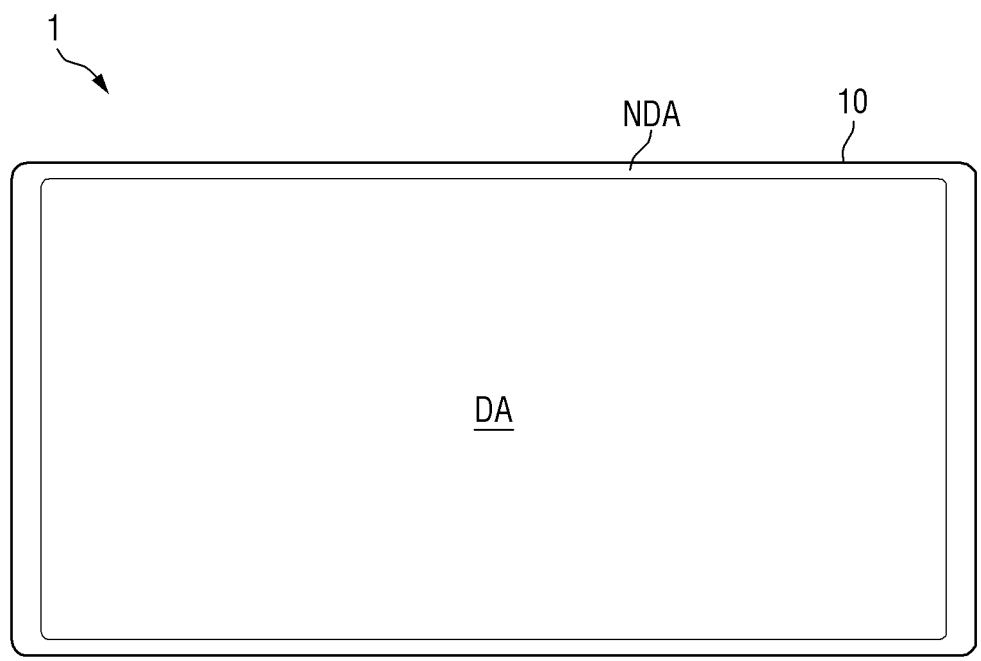
FIG. 1 is a schematic plan view of a display device according to an embodiment.
Figure 1:
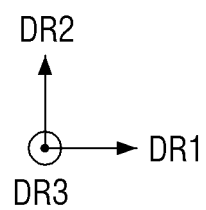

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the implementations or embodiments disclosed herein. It is apparent, however, that various embodiments may be practiced without these details or with one or more equivalent arrangements. In other instances, structures and devices may be shown in block diagram form in order to avoid unnecessarily obscuring various embodiments. Further, various embodiments may be different, but do not have to be exclusive. For example, shapes, configurations, and characteristics of an embodiment may be used or implemented in another embodiment without departing from the scope of the disclosure.

Unless otherwise specified, the illustrated embodiments are to be understood as providing features of varying detail of some or a number of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there may be no intervening elements or layers present. To this end, the term "connected" may refer to physical, electrical, and/or fluid connection, with or without intervening elements. Further, the X-axis, the Y-axis, and the Z-axis may not be limited to three axes of a rectangular coordinate system, such as the x, y, and z axes, and may be interpreted in a broader sense. For example, the X-axis, the Y-axis, and the Z-axis may be substantially perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

As used herein, the term "and/or" includes any and all combinations of one or more of the associated listed items. The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above"

the other elements or features. Thus, the term "below" can encompass both an orientation of above and below. Furthermore, the apparatus may be otherwise oriented (for example, rotated 90 degrees or about 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

In case that an element is described as "not overlapping" or to "not overlap" another element, this may include that the elements are spaced from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well (and vice versa), unless the context clearly indicates otherwise. Moreover, the terms "comprises," "comprising," "has," having", "includes," "including," and/or variations thereof when used in this specification, specify the presence of stated features, integers, steps, operations, elements, components, and/or groups thereof, but do not preclude the presence or addition of one or more other features, integers, steps, operations, elements, components, and/or groups thereof.

It is also noted that, as used herein, the terms "substantially," "about," and "approximately" as used herein are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some or a number of embodiments are described and illustrated in the accompanying drawings in terms of functional blocks, units, and/or modules. Those skilled in the art will appreciate that these blocks, units, and/or modules may be physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some or a number of functions and a processor (for example, one or more programmed microprocessors and associated circuitry) to perform other functions. Also, each block, unit, and/or module of some or a number of embodiments may be physically separated into two or more interacting and discrete blocks, units, and/or modules without departing from the scope of the disclosure. Further, the blocks, units, and/or modules of some or a number of embodiments may be physically combined into more complex blocks, units, and/or modules without departing from the scope of the disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic plan view of a display device 1 according to an embodiment.

Referring to FIG. 1, the display device 1 may be a device for displaying moving images or still images. The display device 1 may be used as a display screen in portable electronic devices such as mobile phones, smartphones, tablet personal computers (PCs), smart watches, watch phones, mobile communication terminals, electronic notebooks, electronic books, portable multimedia players (PMPs), navigation devices and ultra-mobile PCs (UMPCs), as well as in various products such as televisions, notebook computers, monitors, billboards and Internet of things (IoT) devices.

The display device 1 according to the embodiment may be substantially rectangular in plan view. The display device 1 may be shaped like a rectangle with right-angled corners in plan view. However, the disclosure is not limited thereto, and the display device 1 may also be shaped like a rectangle with rounded corners in plan view.

In the drawings, a first direction DR1 may indicate a horizontal direction of the display device 1 in plan view, and a second direction DR2 may indicate a vertical direction of the display device 1 in plan view. A third direction DR3 may indicate a thickness direction of the display device 1. The first direction DR1 and the second direction DR2 may perpendicularly intersect each other, and the third direction DR3 may perpendicularly intersect both the first direction DR1 and the second direction DR2 in a direction intersecting a plane in which the first direction DR1 and the second direction DR2 lie. However, directions mentioned in embodiments should be understood as relative directions, and the embodiments are not limited to the mentioned directions.

Unless otherwise defined, the terms "upper," "upper surface" and "upper side" used herein based on the third direction DR3 may refer to a display surface side of the display device 1, and the terms "lower," "lower surface" and "lower side" may refer to an opposite side of the display device 1 from the display surface side.

The display device 1 may include a display panel 10. The display panel 10 may be an organic light emitting display panel. In the following embodiments, a case where an organic light emitting display panel may be applied as the display panel 10 will be described as an example. However, the disclosure is not limited to this case, and other types of display panels such as a liquid crystal display (LCD), a quantum-dot organic light emitting display (QD-OLED) panel, a quantum-dot LCD (QD-LCD), a quantum-nano light emitting display (NED) panel, and a micro light emitting diode (LED) may also be applicable.

The display panel 10 may include a display area DA where an image may be displayed and a non-display area NDA where no image may be displayed. The display panel 10 may be divided into the display area DA and the non-display area NDA in plan view. The non-display area NDA may surround the display area DA. The non-display area NDA may form a bezel.

The planar shape of each of the display panel 10 and the display area DA of the display panel 10 may correspond to the planar shape of the display device 1. For example, each of the display panel 10 and the display area DA may be shaped like a rectangle with right-angled corners or a rectangle with rounded corners in plan view. However, the planar shape of each of the display panel 10 and the display area DA is not limited to a rectangle, but may also be a circle, an oval, or various other shapes.

The display area DA may include pixels. The pixels may be arranged in a matrix shape. Each of the pixels may include a light emitting layer and a circuit layer for controlling the amount of light emitted from the light emitting layer. The circuit layer may include a wiring, an electrode, and at least one transistor. The light emitting layer may include an organic light emitting material. The light emitting layer may be sealed by an encapsulation film.

Figure 2:
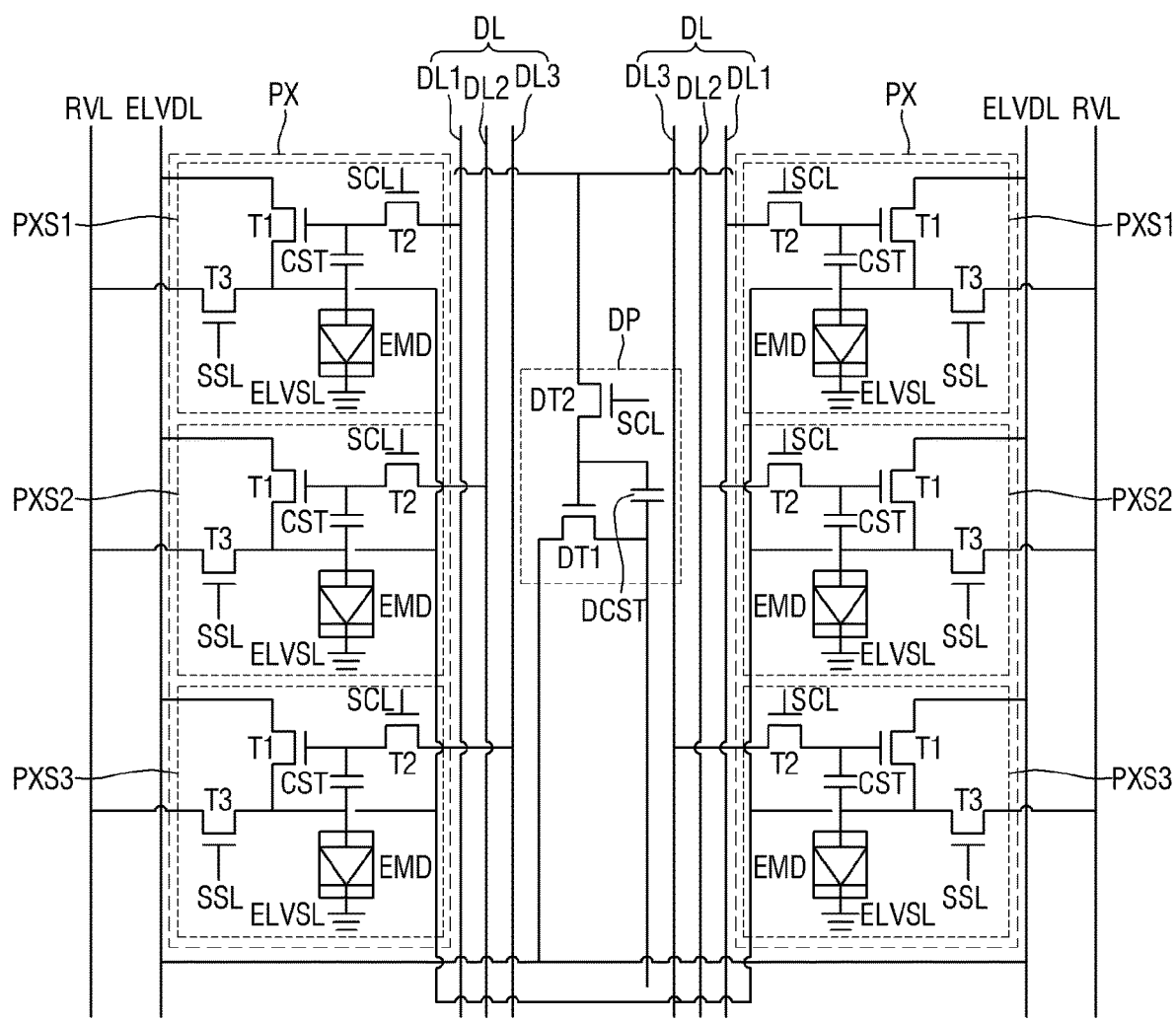
FIG. 2 is a schematic diagram of an equivalent circuit of pixels and a repair circuit of the display device according to an embodiment.
Figure 2:
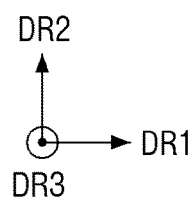

FIG. 2 is an equivalent circuit diagram of pixels PX and a repair circuit DP of the display device 1 according to an embodiment. FIG. 2 illustrates two pixels PX adjacent to each other and the repair circuit DP disposed between the two pixels PX.

Referring to FIG. 2, the display device 1 according to an embodiment may include pixels PX and the repair circuit DP disposed between the pixels PX adjacent to each other.

First, the pixels PX will be described.

A pixel PX may be a minimum repeat unit for display. The pixels PX may be repeatedly arranged in a matrix direction (the first direction DR1 and the second direction DR2), and subpixels PXS may be alternately arranged in the matrix direction (the first direction DR1 and the second direction DR2).

In order to display a full color, each of the pixels PX may include a first subpixel PXS1, a second subpixel PXS2, and a third subpixel PXS3. The subpixels PXS1 through PXS3 may emit light of different colors. For example, the first subpixel PXS1 may emit light of a first color, and the second subpixel PXS2 may emit light of a second color different from the first color. The third subpixel PXS3 may emit light of a third color different from the first color and the second color. For example, the first subpixel PXS1 of each pixel PX may be responsible for emitting blue light, the second subpixel PXS2 may be responsible for emitting green light, and the third subpixel PXS3 may be responsible for emitting red light, although the disclosure is not limited thereto.

Each of the subpixels PXS1 through PXS3 of each pixel PX may include a light emitting element EMD, transistors T1 through T3, and a storage capacitor CST. A data signal, a scan signal, a sensing signal, a first power supply voltage, a second power supply voltage, and an initialization voltage may be applied to the circuit of each pixel PX.

The light emitting element EMD may include a first electrode (or an anode) and a second electrode (or a cathode). The storage capacitor CST may include a first electrode and a second electrode.

The light emitting element EMD may emit light according to a current supplied through a first transistor T1. The light emitting element EMD may be implemented as an organic light emitting diode, a micro light emitting diode, a nano light emitting diode, or the like. The anode of the light emitting element EMD may be connected to a second source/drain (also referred to as "source or drain") electrode of the first transistor T1, and the cathode may be connected to a second power line ELVSL to which a low-potential voltage (the second power supply voltage) lower than a high-potential voltage (the first power supply voltage) of a first power line ELVDL may be supplied.

The transistors may include first through third transistors T1 through T3. Each of the transistors T1 through T3 may include a gate electrode, a first source/drain electrode, and a second source/drain electrode. Any one of the first source/drain electrode and the second source/drain electrode of each of the transistors T1 through T3 may be a source electrode, and the other may be a drain electrode.

Each of the transistors T1 through T3 may be formed as a thin-film transistor. The first transistor T1 may be a driving transistor, and the second transistor T2 and the third transistor T3 may be switching transistors. However, the disclosure is not limited thereto. Although a case where each of the transistors T1 through T3 may be an N-type metal oxide semiconductor field effect transistor (MOSFET) is described as an example, the disclosure is not limited thereto. For example, at least one of the transistors T1 through T3 may be formed as a P-type MOSFET.

The first transistor T1 may adjust a current flowing from the first power line ELVDL, to which the first power supply voltage may be supplied, to the light emitting element EMD according to a voltage difference between the gate electrode and the second source/drain electrode. The gate electrode of the first transistor T1 may be connected to the first electrode of the storage capacitor CST and the second source/drain electrode of the second transistor T2. The first source/drain electrode of the first transistor T1 may be connected to the first power line ELVDL to which the first power supply voltage may be applied, and the second source/drain electrode of the first transistor T1 may be connected to the anode of the light emitting element EMD.

The second transistor T2 may be turned on by a scan signal of a scan line SCL to connect a data line DL to the gate electrode of the first transistor T1. The second transistor T2 may have the gate electrode connected to the scan line SCL, the first source/drain electrode connected to the data line DL, and the second source/drain electrode connected to the gate electrode of the first transistor T1. The data line DL may include first through third sub-data lines DL1 through DL3. Each of the sub-data lines DL1 through DL3 may be connected to the second transistor T2 of each of the subpixels PXS1 through PXS3.

The third transistor T3 may be turned on by a sensing signal of a sensing line SSL to connect a reference voltage line RVL to the second source/drain electrode of the first transistor T1. The third transistor T3 may have the gate electrode connected to the sensing line SSL, the first source/drain electrode connected to the reference voltage line RVL, and the second source/drain electrode connected to the second source/drain electrode of the first transistor T1.

The storage capacitor CST may be disposed between the gate electrode of the first transistor T1 and the second source/drain electrode of the first transistor T1. The storage capacitor CST may store a difference voltage between a gate voltage and a second source/drain voltage of the first transistor T1.

Next, the repair circuit DP will be described.

The repair circuit DP may be provided in plural numbers. Each of multiple repair circuits DP may be disposed between two pixels PX adjacent to each other, but the disclosure is not limited thereto. The repair circuit DP may include a first repair transistor DT1, a second repair transistor DT2, and a repair capacitor DCST. The first repair transistor DT1 may be a driving transistor, and the second repair transistor DT2 may be a switching transistor. However, the disclosure is not limited thereto.

Each of the first repair transistor DT1 and the second repair transistor DT2 may include a gate electrode, a first source/drain electrode, and a second source/drain electrode. Any one of the first source/drain electrode and the second source/drain electrode of each of the repair transistors DT1 and DT2 may be a source electrode, and the other may be a drain electrode. The repair capacitor DCST may include a first electrode and a second electrode.

The gate electrode of the first repair transistor DT1 may be connected to the first electrode of the repair capacitor DCST and the second source/drain electrode of the second repair transistor DT2. The first source/drain electrode of the first repair transistor DT1 may be connected to the first power line ELVDL to which the first power supply voltage may be applied, and the second source/drain electrode of the first repair transistor DT1 may be connected to the second electrode of the repair capacitor DCST. As will be described later, during a repair operation, the second source/drain electrode of the first repair transistor DT1 may be connected to the anode of the light emitting element EMD. This will be described in detail later.

The gate electrode of the second repair transistor DT2 may be connected to the scan line SCL. The second source/drain electrode of the second repair transistor DT2 may be connected to the gate electrode of the first transistor T1. As will be described later, during a repair operation, the first source/drain electrode of the second repair transistor DT2 may be connected to the data line DL. This will be described in detail later.

The repair capacitor DCST may be disposed between the gate electrode of the first repair transistor DT1 and the second source/drain electrode of the first repair transistor DT1. The repair capacitor DCST may store a difference voltage between a gate voltage and a second source/drain voltage of the first repair transistor DT1.

The first repair transistor DT1 of the repair circuit DP may include substantially the same elements and substantially the same structure as the first transistor T1 of each of the subpixels PXS1 through PXS3. The second repair transistor DT2 of the repair circuit DP may include substantially the same elements and substantially the same structure as the second transistor T2 of each of the subpixels PXS1 through PXS3. The repair capacitor DCST of the repair circuit DP may include substantially the same elements and substantially the same structure as the storage capacitor CST of each of the subpixels PXS1 through PXS3. However, the disclosure is not limited thereto.

The connection relationship between the first repair transistor DT1, the second repair transistor DT2 and the repair capacitor DCST of the repair circuit DP may be substantially the same as the connection relationship between the first transistor T1, the second transistor T2 and the storage capacitor CST of each of the subpixels PXS1 through PXS3. However, the disclosure is not limited thereto.

Figure 3:
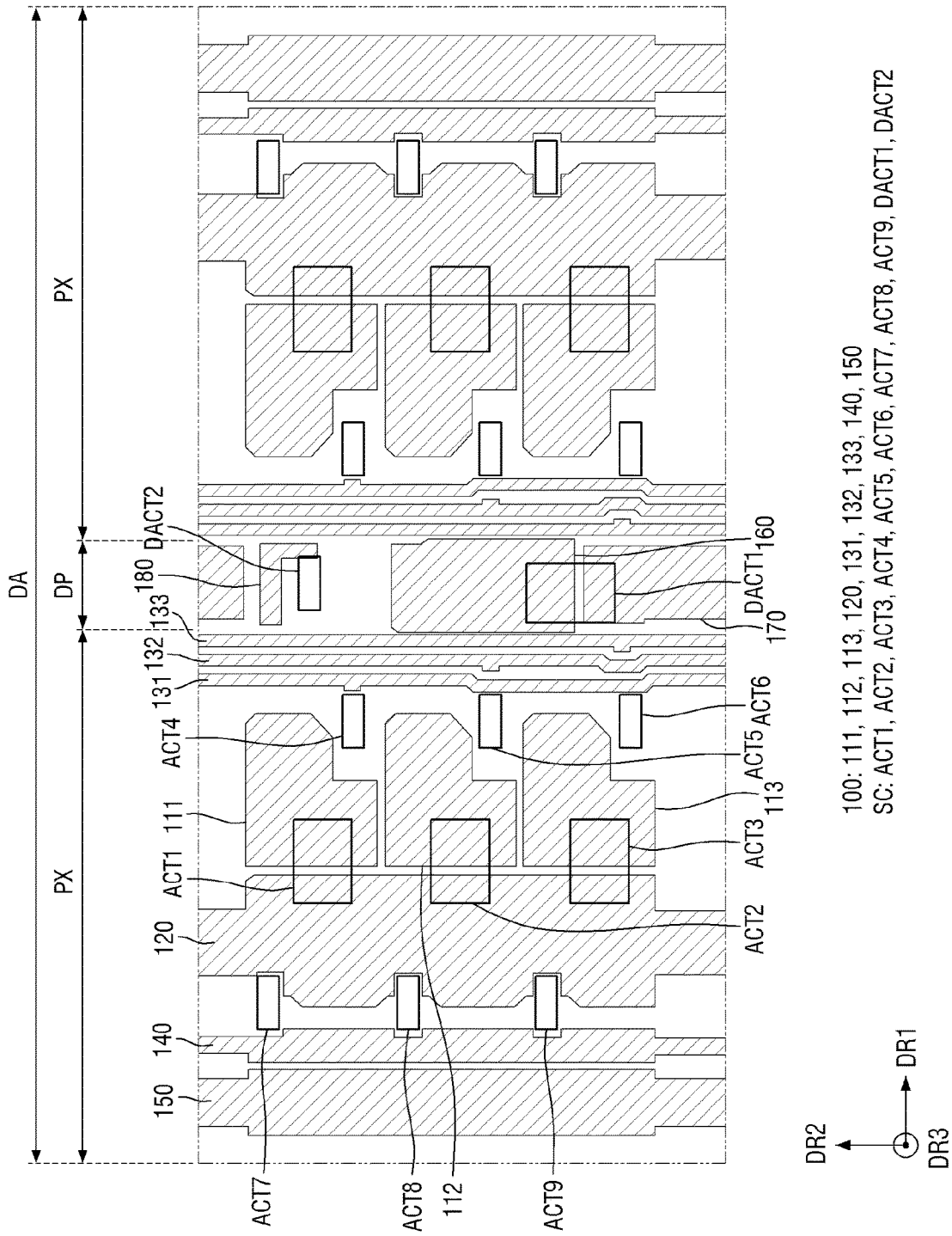
FIG. 3 is a schematic layout view of a first conductive layer and a semiconductor layer of a pixel according to an embodiment.
Figure 4:
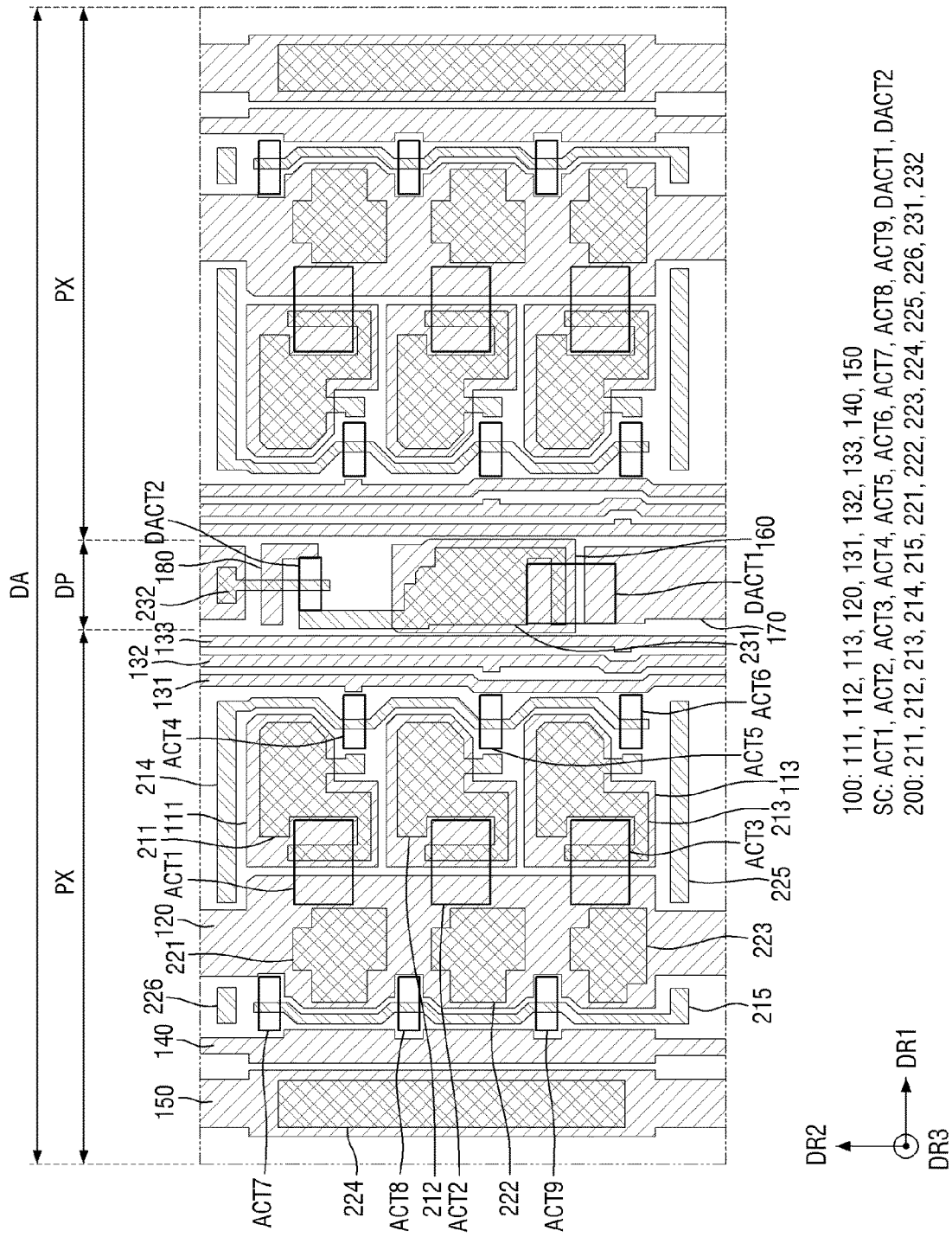
FIG. 4 is a schematic layout view of the first conductive layer, the semiconductor layer, and a second conductive layer of a pixel according to an embodiment.
Figure 5:
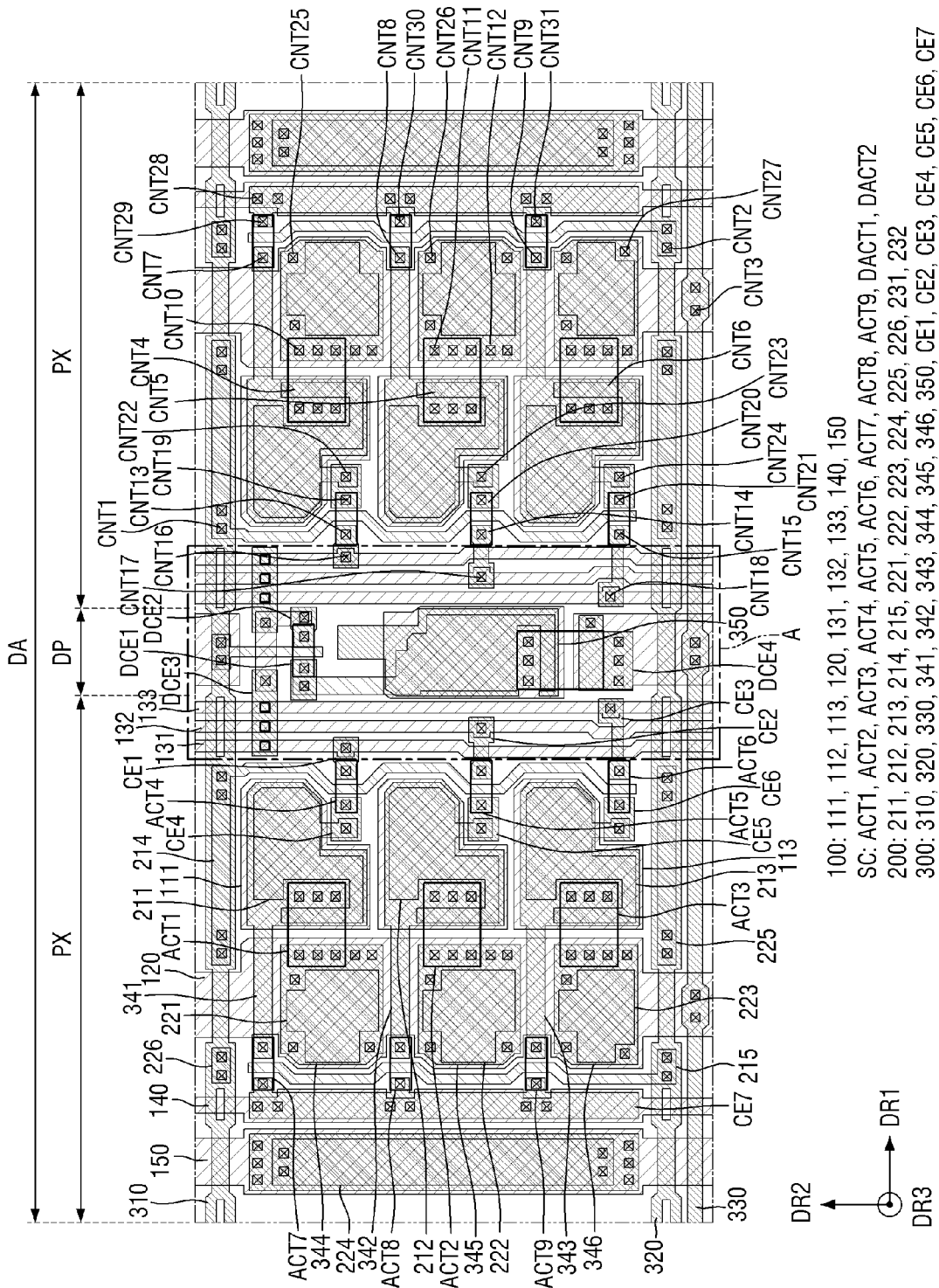
FIG. 5 is a schematic layout view of the first conductive layer, the semiconductor layer, the second conductive layer, and a third conductive layer of a pixel according to an embodiment.
Figure 6:
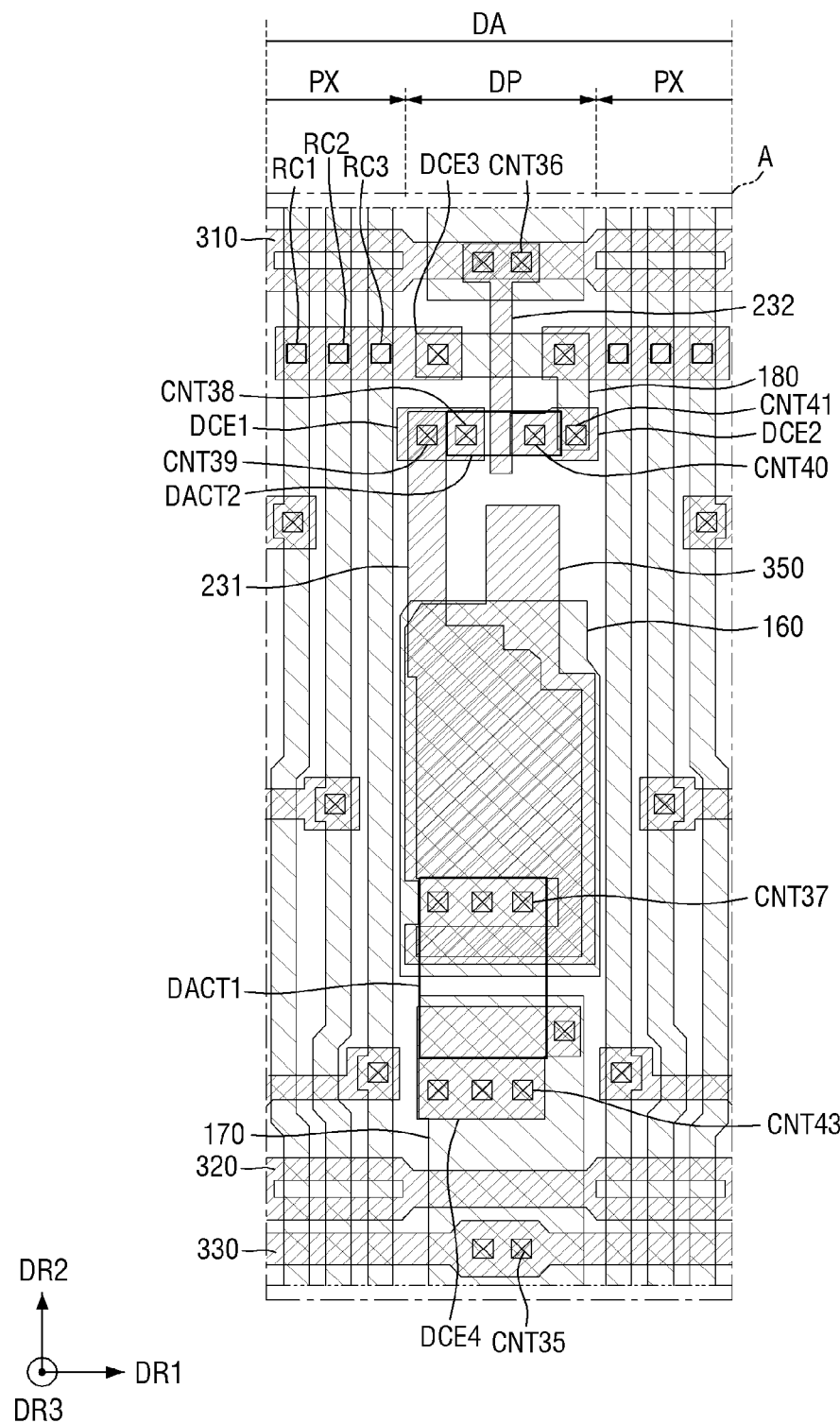
FIG. 6 is an enlarged schematic view of area A of FIG. 5.
Figure 7:
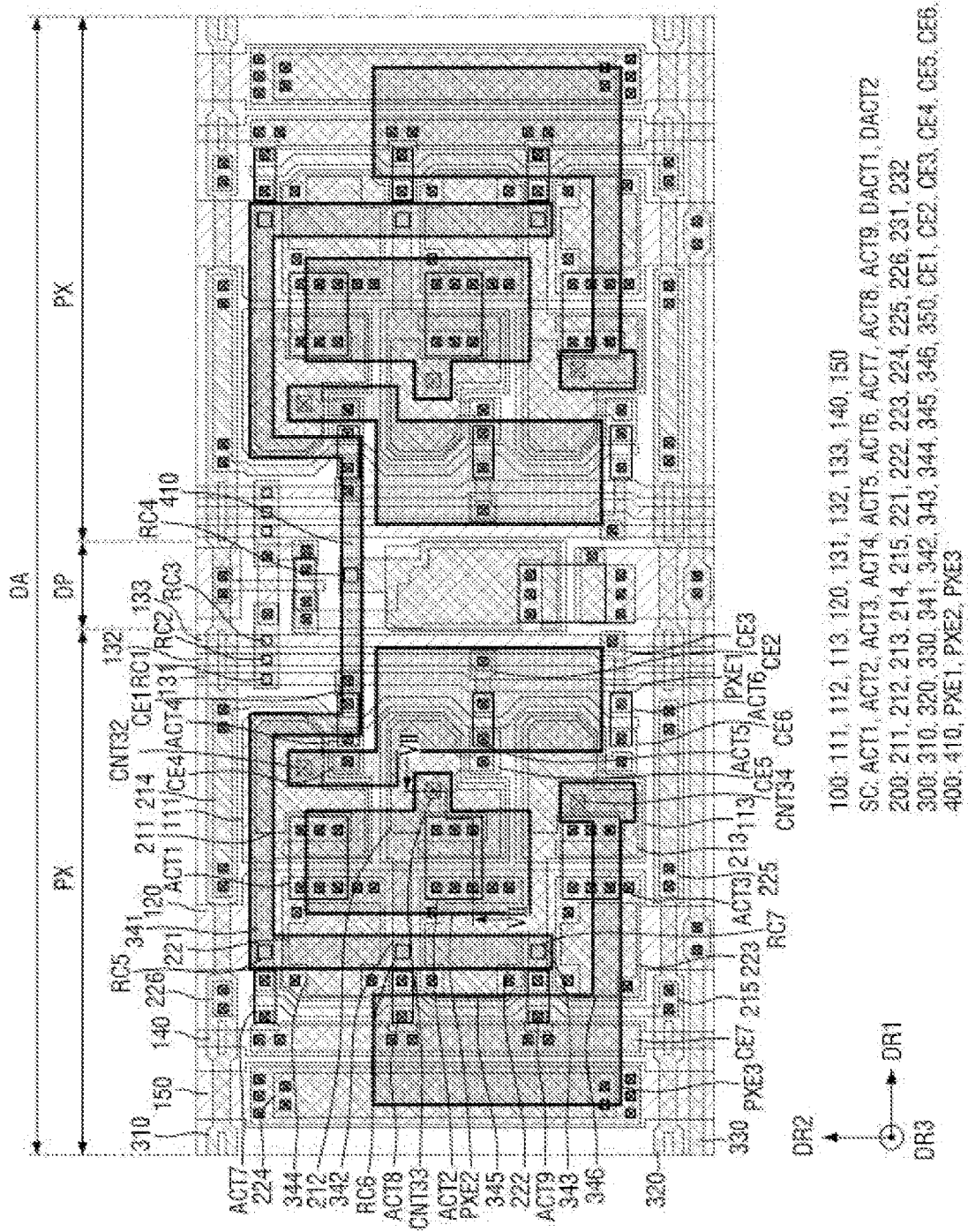
FIG. 7 is a schematic layout view of the first conductive layer, the semiconductor layer, the second conductive layer, the third conductive layer, and a fourth conductive layer of a pixel according to an embodiment.
Figure 8:
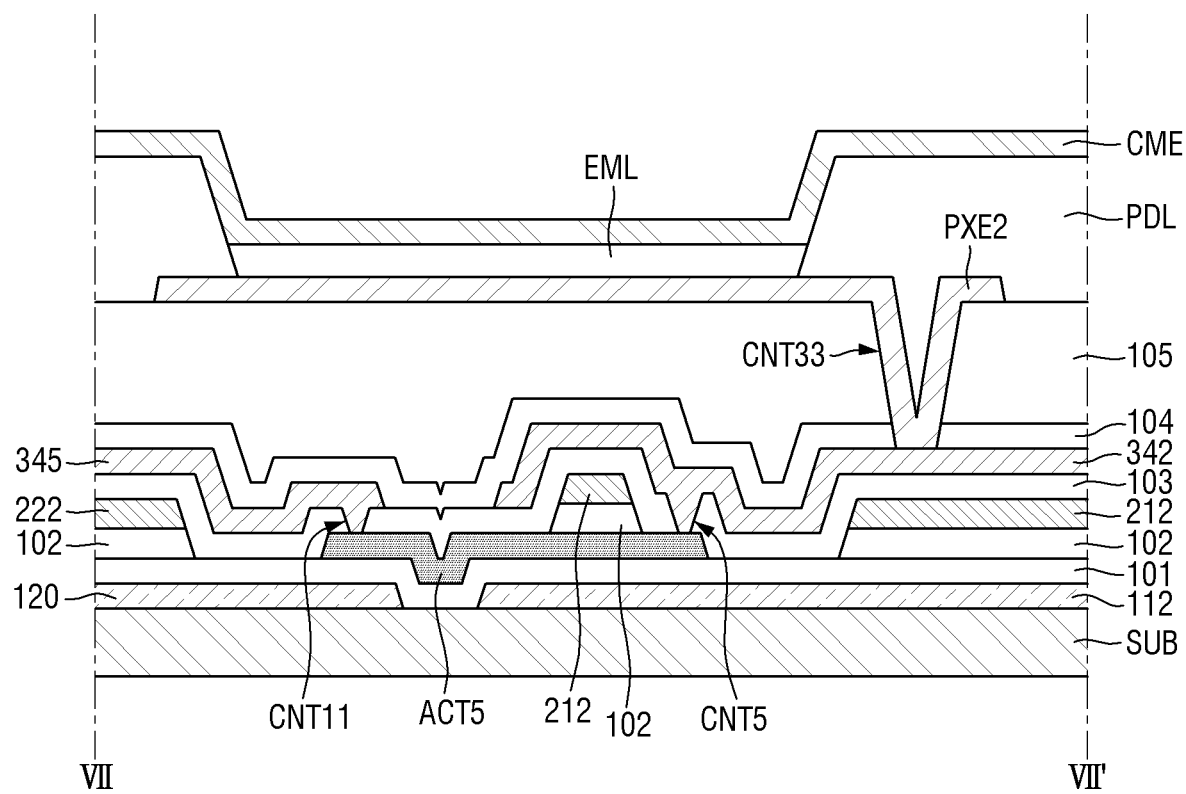
FIG. 8 is a schematic cross-sectional view taken along line VII-VII' of FIG. 7.

FIG. 3 is a schematic layout view of a first conductive layer 100 and a semiconductor layer SC of a pixel PX according to an embodiment. FIG. 4 is a schematic layout view of the first conductive layer 100, the semiconductor layer SC, and a second conductive layer 200 of a pixel PX according to an embodiment. FIG. 5 is a schematic layout view of the first conductive layer 100, the semiconductor layer SC, the second conductive layer 200, and a third conductive layer 300 of a pixel PX according to an embodiment. FIG. 6 is an enlarged schematic view of area A of FIG. 5. FIG. 7 is a schematic layout view of the first conductive layer 100, the semiconductor layer SC, the second conductive layer 200, the third conductive layer 300, and a fourth conductive layer 400 of a pixel PX according to an embodiment. FIG. 8 is a schematic cross-sectional view taken along line VII-VII' of FIG. 7.

Referring to FIGS. 2 through 8, the display device 1 (see FIG. 1) may include a substrate SUB which may support elements disposed thereon and may include the semiconductor layer SC, conductive layers and insulating layers disposed on the substrate SUB. The conductive layers may include the first conductive layer 100, the second conductive layer 200, the third conductive layer 300, and the fourth conductive layer 400. The insulating layers may include a buffer layer 101, a gate insulating layer 102, an interlayer insulating layer 103, a passivation layer 104, and a via layer 105.

For ease of description, new reference numerals may be given to elements substantially the same as those of FIG. 2.

First, a pixel PX will be described.

The substrate SUB may be an insulating substrate and may include a transparent material.

The first conductive layer 100 may be disposed on the substrate SUB. The first conductive layer 100 may include first through third lower light blocking patterns 111 through 113, the first power line 120 (ELVDL in FIG. 2), the first through third data lines 131 through 133 (DL1 through DL3 in FIG. 2), the reference voltage line 140 (RVL in FIG. 2), and the second voltage line 150 (ELVSL in FIG. 2). The first conductive layer 100 may be, but is not limited to, a Ti/Cu double layer in which a titanium layer and a copper layer may be stacked on each other.

The first lower light blocking pattern 111, the second lower light blocking pattern 112, and the third lower light blocking pattern 113 may protect the semiconductor layer SC from external light. The first lower light blocking pattern 111, the second lower light blocking pattern 112, and the third lower light blocking pattern 113 may have a patterned shape. The first lower light blocking pattern 111, the second lower light blocking pattern 112, and the third lower light blocking pattern 113 may be disposed under the semiconductor layer SC to cover at least a channel region of the semiconductor layer SC and, by extension, the entire semiconductor layer SC.

The first power line 120 may transmit the first power supply voltage to each of the subpixels PXS1 through PXS3. The first power line 120 may be disposed on a first side, e.g., a left side of the center of the pixel PX in the first direction DR1 and may extend in the second direction DR2. The first power line 120 may extend to other pixels PX neighboring the pixel PX in the second direction DR2. The first power line 120 may overlap first through third semiconductor patterns ACT1 through ACT3, but the disclosure is not limited thereto.

The first power line 120 may be electrically connected to the first through third semiconductor patterns ACT1 through ACT3 through fourth through sixth data conductive patterns 344 through 346, respectively. Accordingly, the first power voltage may be transmitted to the first transistor T1 of each of the subpixels PXS1 through PXS3.

The first through third data lines 131 through 133 may transmit data signals to each of the subpixels PXS1 through PXS3. The first through third data lines 131 through 133 may be disposed on a second side, e.g., a right side of the center of the pixel PX in the first direction DR1 and may extend in the second direction DR2. The first through third data lines 131 through 133 may extend to other pixels PX neighboring the pixel PX in the second direction DR2.

The first data line 131 may be electrically connected to a fourth semiconductor pattern ACT4 through a first contact pattern CE1. Accordingly, a data signal may be transmitted to the second transistor T2 of the first subpixel PXS1. The second data line 132 may be electrically connected to a fifth semiconductor pattern ACT5 through a second contact pattern CE2. Accordingly, a data signal may be transmitted to the second transistor T2 of the second subpixel PXS2. The third data line 133 may be electrically connected to a sixth semiconductor pattern ACT6 through a third contact pattern CE3. Accordingly, a data signal may be transmitted to the second transistor T2 of the third subpixel PXS3.

The reference voltage line 140 may transmit a reference voltage to each of the subpixels PXS1 through PXS3. The reference voltage line 140 may be disposed on a first side, e.g., a left side of the first power line 120 in the first direction DR1 and may extend in the second direction DR2. The reference voltage line 140 may extend to other pixels PX neighboring the pixel PX in the second direction DR2.

The reference voltage line 140 may be electrically connected to each of seventh through ninth semiconductor patterns ACT7 through ACT9 through a seventh contact pattern CE7. Accordingly, the reference voltage may be transmitted to the third transistor T3 of each of the subpixels PXS1 through PXS3.

The second voltage line 150 may transmit the second power supply voltage to each of the subpixels PXS1 through PXS3. The second voltage line 150 may be disposed on a first side, e.g., a left side of the reference voltage line 140 in the first direction DR1 and may extend in the second direction DR2. The second voltage line 150 may extend to other pixels PX neighboring the pixel PX in the second direction DR2.

The buffer layer 101 may be disposed on the first conductive layer 100. The buffer layer 101 may cover the entire surface of the substrate SUB on which the first conductive layer 100 may be disposed. The buffer layer 101 may include silicon nitride, silicon oxide, silicon oxynitride, or a combination thereof. In an embodiment, the buffer layer 101 may include a double layer of $SiN_x/SiO_x$.

The semiconductor layer SC may be disposed on the buffer layer 101. The semiconductor layer SC may include the first through ninth semiconductor patterns ACT1 through ACT9.

The first through third semiconductor patterns ACT1 through ACT3 may be active layers of the first transistors T1 included in the pixel PX, the fourth through sixth semiconductor patterns ACT4 through ACT6 may be active layers of the second transistors T2, and the seventh through ninth semiconductor patterns ACT7 through ACT9 may be active layers of the third transistors T3.

The first through ninth semiconductor patterns ACT1 through ACT9 may extend in the first direction DR1, that is, the horizontal direction in the drawings and may have a rectangular shape or a shape having widened ends. Each of the first through ninth semiconductor patterns ACT1 through ACT9 may include a channel region overlapping the gate electrode in the thickness direction (the third direction DR3) and a conducting region located on a side and another side of the channel region. The conducting region may have greater conductivity and lower electrical resistance than the channel region. The conducting region of each of the first through ninth semiconductor patterns ACT1 through ACT9 may include the source electrode and the drain electrode (or the first source/drain electrode and the second source/drain electrode) of each transistor in an area overlapping the third conductive layer 300.

The first through third semiconductor patterns ACT1 through ACT3 may be located near the center in the pixel PX in the first direction DR1. The first semiconductor pattern ACT1 may be located above the second semiconductor pattern ACT2 and the third semiconductor pattern ACT3 in the second direction DR2 in the drawings, and the second semiconductor pattern ACT2 may be located above the third semiconductor pattern ACT3 in the second direction DR2 in the drawings. The first through third semiconductor patterns ACT1 through ACT3 may be the active layers of the first transistors T1 of the first through third subpixels PXS1 through PXS3, respectively.

The fourth through sixth semiconductor patterns ACT4 through ACT6 may be located on the right side in the pixel PX in the first direction DR1 in the drawings. The fourth semiconductor pattern ACT4 may be located above the fifth semiconductor pattern ACT5 and the sixth semiconductor pattern ACT6 in the second direction DR2 in the drawings, and the fifth semiconductor pattern ACT5 may be located above the sixth semiconductor pattern ACT6 in the second direction DR2 in the drawings. The fourth through sixth semiconductor patterns ACT4 through ACT6 may be the active layers of the second transistors T2 of the first through third subpixels PXS1 through PXS3, respectively.

The seventh through ninth semiconductor patterns ACT7 through ACT9 may be located on the left side in the pixel PX in the first direction DR1 in the drawings. The seventh semiconductor pattern ACT7 may be located above the eighth semiconductor pattern ACT8 and the ninth semiconductor pattern ACT9 in the second direction DR2 in the drawings, and the eighth semiconductor pattern ACT8 may be located above the ninth semiconductor pattern ACT9 in the second direction DR2 in the drawings. The seventh through ninth semiconductor patterns ACT7 through ACT9 may be the active layers of the third transistors T3 of the first through third subpixels PXS1 through PXS3, respectively.

The semiconductor layer SC may include an oxide semiconductor. The oxide semiconductor may include indium-tin oxide (ITO), indium-tin-gallium oxide (ITGO), indium-gallium-zinc oxide (IGZO), indium-gallium-zinc-tin oxide (IGZTO), or a combination thereof. However, the disclosure is not limited thereto, and the semiconductor layer SC may also be made of polycrystalline silicon, monocrystalline silicon, amorphous silicon, or a combination thereof.

The gate insulating layer 102 may be disposed on the semiconductor layer SC. The gate insulating layer 102 may include substantially the same pattern as the second conductive layer 200 in plan view. In other words, the gate insulating layer 102 may include a pattern corresponding to the pattern of the second conductive layer 200. The pattern of the gate insulating layer 102 may be substantially the same as the pattern of the second conductive layer 200, but the pattern of the gate insulating layer 102 may be enlarged from the pattern of the second conductive layer 200. The entire area of the second conductive layer 200 may overlap (e.g., completely overlap) the gate insulating layer 102, but only a part of the gate insulating layer 102 may overlap the second conductive layer 200.

The gate insulating layer 102 may include a silicon compound, a metal oxide, or the like, or a combination thereof. For example, the gate insulating layer 102 may include silicon oxide, silicon nitride, silicon oxynitride, aluminum oxide, tantalum oxide, hafnium oxide, zirconium oxide, titanium oxide, or a combination thereof.

The second conductive layer 200 may be disposed on the gate insulating layer 102. The second conductive layer 200 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second conductive layer 200 may be a single layer or a multilayer.

The second conductive layer 200 may include first through fifth gate conductive patterns 211 through 215 and first through sixth overlapping conductive patterns 221 through 226.

The first through fifth gate conductive patterns 211 through 215 may partially overlap the first through ninth semiconductor patterns ACT1 through ACT9. In the overlapping areas, the first through fifth gate conductive patterns 211 through 215 may include the gate electrodes of the respective transistors of the subpixels PXS1 through PXS3.

In other words, the first gate conductive pattern 211 may overlap a part of the first semiconductor pattern ACT1 to include the gate electrode of the first transistor T1 of the first subpixel PXS1. The first gate conductive pattern 211 may overlap at least a channel region of the first semiconductor pattern ACT1. Similarly, the second gate conductive pattern 212 may overlap a part of the second semiconductor pattern ACT2, and the third gate conductive pattern 213 may overlap a part of the third semiconductor pattern ACT3. They may include the gate electrode of the first transistor T1 of the second subpixel PXS2 and the gate electrode of the first transistor T1 of the third subpixel PXS3, respectively.

The first through third gate conductive patterns 211 through 213 may respectively overlap first through third data conductive patterns 341 through 343 and include the first electrodes of the respective storage capacitors CST of the subpixels PXS1 through PXS3 in the overlapping areas. The first electrodes of the respective storage capacitors CST of the subpixels PXS1 through PXS3 may be formed of the first through third gate conductive patterns 211 through 213 themselves or may be formed of parts extending from the respective gate electrodes of the transistors T1 through T3, respectively.

The fourth gate conductive pattern 214 may overlap a part of each of the fourth through sixth semiconductor patterns ACT4 through ACT6 to include the gate electrodes of the respective second transistors T2 of the first through third subpixels PXS1 through PXS3. The fourth gate conductive pattern 214 may overlap a channel region of each of the fourth through sixth semiconductor patterns ACT4 through ACT6. The fourth gate conductive pattern 214 may be electrically connected to a scan line 310.

The fifth gate conductive pattern 215 may overlap a part of each of the seventh through ninth semiconductor patterns ACT7 through ACT9 to include the gate electrodes of the respective third transistors T3 of the first through third subpixels PXS1 through PXS3. The fifth gate conductive pattern 215 may overlap a channel region of each of the seventh through ninth semiconductor patterns ACT7 through ACT9. The fifth gate conductive pattern 215 may be electrically connected to a sensing line 320.

Each of the first through sixth overlapping conductive patterns 221 through 226 may overlap at least one of the first power line 120, the second power line 150, the scan line 310 and the sensing line 320 and may be electrically connected to the overlapping line through a contact hole or the like. Accordingly, the electrical resistance of each wiring may be reduced, and signals and voltages may be transmitted more smoothly. For example, the first through third overlapping conductive patterns 221 through 223 may overlap the first power line 120 and may be electrically connected to the first power line 120 through contact holes or the like. The fourth overlapping conductive pattern 224 may overlap the second power line 150 and may be electrically connected to the second power line 150 through a contact hole or the like. The fifth overlapping conductive pattern 225 may overlap the scan line 310 and may be electrically connected to the scan line 310 through a contact hole or the like. The sixth overlapping conductive pattern 225 may overlap the sensing line 320 and may be electrically connected to the sensing line 320 through a contact hole or the like.

The interlayer insulating layer 103 may be disposed on the second conductive layer 200. The interlayer insulating layer 103 formed on the second conductive layer 200 may include an inorganic insulating material such as silicon oxide, silicon nitride, silicon oxynitride, hafnium oxide, aluminum oxide, titanium oxide, tantalum oxide, zinc oxide, or a combination thereof.

The third conductive layer 300 may be disposed on the interlayer insulating layer 103. The third conductive layer 300 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 300 may be a single layer or a multilayer. For example, the third conductive layer 300 may include a stacked structure of Ti/Al/Ti, Mo/Al/Mo, Mo/AlGe/Mo, or Ti/Cu.

The third conductive layer 300 may include the scan line 310 (SCL in FIG. 2), the sensing line 320 (SSL in FIG. 2), a sub-first power line 330, the first through sixth data conductive patterns 341 through 346, and first through seventh contact patterns CE1 through CE7.

The scan line 310 may transmit a scan signal to the gate electrode of the second transistor T2 of each of the subpixels PXS1 through PXS3. The scan line 310 may be located on an upper side of the pixel PX in the drawings and may extend in the first direction DR1. The scan line 310 may extend to other pixels PX neighboring the pixel PX in the first direction DR1.

The scan line 310 may overlap at least a part of the fourth gate conductive pattern 214. In the overlapping area, the scan line 310 may be electrically connected to the fourth gate conductive pattern 214 through a contact hole CNT1 penetrating the interlayer insulating layer 103 to expose the fourth gate conductive pattern 214.

The sensing line 320 may transmit a sensing signal to the third transistor T3 of each of the subpixels PXS1 through PXS3. The sensing line 320 may be located on a lower side of the pixel PX in the drawings and may extend in the first direction DR1. The sensing line 320 may extend to other pixels PX neighboring the pixel PX in the first direction DR1.

The sensing line 320 may overlap at least a part of the fifth gate conductive pattern 215. In the overlapping area, the sensing line 320 may be electrically connected to the fifth gate conductive pattern 215 through a contact hole CNT2 penetrating the interlayer insulating layer 103 to expose the fifth gate conductive pattern 215.

Each of the scan line 310 and the sensing line 320 extending in the first direction DR1 may bifurcate in areas intersecting the first through third data lines 131 through 133 and the reference voltage line 140, which extend in the second direction DR2, to extend in the first direction DR1. In other words, each of the scan line 310 and the sensing line 320 may extend in the first direction DR1 as one wiring on a first side and a second side of the first through third data lines 131 through 133 and the reference voltage line 140 in the first direction DR1 and may bifurcate in the areas intersecting the first through third data lines 131 through 133 and the reference voltage line 140 to extend in the first direction DR1.

The sub-first power line 330 may extend in the first direction DR1 and receive the first power supply voltage. The sub-first power line 330 may be disposed between the scan line 310 and the sensing line 320. The sub-first power line 330 may extend to other pixels PX neighboring the pixel PX in the first direction DR1.

The sub-first power line 330 may form a mesh structure together with the first power line 120 and may be electrically connected to the first power line 120 through a contact hole CNT3 penetrating the interlayer insulating layer 103 and the buffer layer 101 in the thickness direction (the third direction DR3) to expose a part of the first power line 120.

The first through sixth data conductive patterns 341 through 346 may be disposed between the first power line 120 and the first through third data lines 131 through 133. The fourth through sixth data conductive patterns 344 through 346 may be disposed on a first side (e.g., a left side) of the first through third data conductive patterns 341 through 343 in the first direction DR1.

The first through third data conductive patterns 341 through 343 may overlap the first through third semiconductor patterns ACT1 through ACT3, respectively. In the overlapping areas, the first through third data conductive patterns 341 through 343 may be respectively electrically connected to the first through third semiconductor patterns ACT1 through ACT3 through contact holes CNT4 through CNT6 penetrating the interlayer insulating film 103 to partially expose the first through third semiconductor patterns ACT1 through ACT3. The first through third data conductive patterns 341 through 343 may include the second source/drain electrodes of the respective first transistors T1 of the subpixels PXS1 through PXS3.

At least a part of each of the first through third data conductive patterns 341 through 343 may include an area protruding in the first direction DR1. The protruding area may intersect the first power line 120 and extend toward a first side (e.g., a left side) in the first direction DR1. The protruding area may overlap at least a part of the first power line 120 and may be insulated from the first power line 120 by the buffer layer 101 and the interlayer insulating layer 103 in the overlapping area.

The protruding area of the first data conductive pattern 341 may be located on a first side of the fourth data conductive pattern 344 in the second direction DR2 and may be disposed between the fourth data conductive pattern 344 and the scan line 310. The protruding area of the second data conductive pattern 342 may be disposed between the fourth data conductive pattern 344 and the fifth data conductive pattern 345. The protruding area of the third data conductive pattern 343 may be disposed between the fifth data conductive pattern 345 and the sixth data conductive pattern 346.

The first through third data conductive patterns 341 through 343 may respectively overlap the seventh through ninth semiconductor patterns ACT7 through ACT9 in the respective protruding areas of the first through third data conductive patterns 341 through 343. In the overlapping areas, the first through third data conductive patterns 341 through 343 may be respectively electrically connected to the seventh through ninth semiconductor patterns ACT7 through ACT9 through contact holes CNT7 through CNT9 penetrating the interlayer insulating film 103 to partially expose the seventh through ninth semiconductor patterns ACT7 through ACT9. The first through third data conductive patterns 341 through 343 may include the second source/drain electrodes of the respective third transistors T3 of the subpixels PXS1 through PXS3.

The first through third data conductive patterns 341 through 343 may overlap the first through third gate conductive patterns 211 through 213, respectively. In the overlapping areas, the first through third data conductive patterns 341 through 343 may include the second electrodes of the respective storage transistors CST of the subpixels PXS1 through PXS3, respectively. For example, in parts not overlapping the first through third semiconductor patterns ACT1 through ACT3 and overlapping the first through third gate conductive patterns 211 through 213, the first through third data conductive patterns 341 through 343 may include the second electrodes of the respective storage capacitors CST of the subpixels PXS1 through PXS3, respectively.

The fourth through sixth data conductive patterns 344 through 346 may overlap the seventh through ninth semiconductor patterns ACT7 through ACT9, respectively. In the overlapping areas, the fourth through sixth data conductive patterns 344 through 346 may be respectively electrically connected to the seventh through ninth semiconductor patterns ACT7 through ACT9 through contact holes CNT10 through CNT12 penetrating the interlayer insulating film 103 to partially expose the seventh through ninth semiconductor patterns ACT7 through ACT9. The fourth through sixth data conductive patterns 344 through 346 may include the first source/drain electrodes of the respective first transistors T1 of the subpixels PXS1 through PXS3.

The fourth through sixth data conductive patterns 344 through 346 may respectively overlap the first through third overlapping conductive patterns 221 through 223 and may be electrically connected to the first through third overlapping conductive patterns 221 through 223 through contact holes in the overlapping areas.

The fourth through sixth data conductive patterns 344 through 346 may each overlap the first power line 120 and, in the overlapping areas, may be electrically connected to the first power line 120 through contact holes CNT25 through CNT27 penetrating the interlayer insulating layer 103 and the buffer layer 101 to expose the first power line 120.

For example, the first power line 120 may be electrically connected to the first through third semiconductor patterns ACT1 through ACT3 through the fourth through sixth data conductive patterns 344 through 346.

The first through third contact patterns CE1 through CE3 may overlap the fourth through sixth semiconductor patterns ACT4 through ACT6, respectively. In the overlapping areas, the first through third contact patterns CE1 through CE3 may be respectively electrically connected to the fourth through sixth semiconductor patterns ACT4 through ACT6 through contact holes CNT13 through CNT15 penetrating the interlayer insulating layer 103 to partially expose the fourth through sixth semiconductor patterns ACT4 through ACT6. The first through third contact patterns CE1 through CE3 may include the first source/drain electrodes of the respective second transistors T2 of the subpixels PXS1 through PXS3, respectively.

The first through third contact patterns CE1 through CE3 may overlap the first through third data lines 131 through 133, respectively. In the overlapping areas, the first through third contact patterns CE1 through CE3 may be respectively electrically connected to the first through third data lines 131 through 133 through contact holes CNT16 through CNT18 penetrating the interlayer insulating layer 103 and the buffer layer 101 to partially expose the first through third data lines 131 through 133.

For example, the fourth through sixth semiconductor patterns ACT4 through ACT6 may be electrically connected to the first through third data lines 131 through 133 through the first through third contact patterns CE1 through CE3.

The second contact pattern CE2 may intersect the first data line 131, and the third contact pattern CE3 may intersect the first data line 131 and the second data line 132. The buffer layer 101 and the interlayer insulating layer 103 may be disposed in an area in which the second contact pattern CE2 overlaps the first data line 131 and an area in which the third contact pattern CE3 overlaps the first data line 131 and the second data line 132. Thus, the second contact pattern CE2 may be insulated from the first data line 131, and the third contact pattern CE3 may be insulated from the first data line 131 and the second data line 132.

The fourth through sixth contact patterns CE4 through CE6 may overlap the fourth through sixth semiconductor patterns ACT4 through ACT6, respectively. In the overlapping areas, the fourth through sixth contact patterns CE4 through CE6 may be respectively electrically connected to the fourth through sixth semiconductor patterns ACT4 through ACT6 through contact holes CNT19 through CNT21 penetrating the interlayer insulating layer 103 to partially expose the fourth through sixth semiconductor patterns ACT4 through ACT6.

The fourth through sixth contact patterns CE4 through CE6 may overlap the first through third gate conductive patterns 211 through 213, respectively. In the overlapping areas, the fourth through sixth contact patterns CE4 through CE6 may be respectively electrically connected to the first through third gate conductive patterns 211 through 213 through contact holes CNT22 through CNT24 penetrating the interlayer insulating layer 103 to partially expose the first through third gate conductive patterns 211 through 213.

For example, the fourth through sixth semiconductor patterns ACT4 through ACT6 may be electrically connected to the first through third gate conductive patterns 211 through 213 through the fourth through sixth contact patterns CE4 through CE6. The fourth through sixth contact patterns CE4 through CE6 may include the second source/drain electrodes of the respective second transistors T2 of the subpixels PXS1 through PXS3.

The seventh contact pattern CE7 may overlap the reference voltage line 140. In the overlapping area, the seventh contact pattern CE7 may be electrically connected to the reference voltage line 140 through a contact hole CNT28 penetrating the interlayer insulating layer 103 and the buffer layer 101 to expose a part of the reference voltage line 140.

The seventh contact pattern CE7 may overlap each of the seventh through ninth semiconductor patterns ACT7 through ACT9. In the overlapping areas, the seventh contact pattern CE7 may be electrically connected to the seventh through ninth semiconductor patterns ACT7 through ACT9 through contact holes CNT29 through CNT31 penetrating the interlayer insulating film 103 to partially expose the seventh through ninth semiconductor patterns ACT7 through ACT9. The seventh contact pattern CE7 may include the first source/drain electrodes of the respective third transistors T3 of the subpixels PXS1 through PXS3.

For example, the reference voltage line 140 may be electrically connected to the seventh through ninth semiconductor patterns ACT7 through ACT9 through the seventh contact pattern CE7.

The passivation layer 104 may be disposed on the third conductive layer 300. The passivation layer 104 may protect the third conductive layer 300 by covering the third conductive layer 300. The passivation layer 104 may include an inorganic insulating material such as silicon oxide, silicon nitride, silicon oxynitride, hafnium oxide, aluminum oxide, titanium oxide, tantalum oxide, zinc oxide, or a combination thereof.

The via layer 105 may be disposed on the passivation layer 104. The via layer 105 may cover (e.g., completely cover) an upper surface of the passivation layer 104 on which the fourth conductive layer 400 may be disposed. In case that the via layer 105 is formed of an organic layer, an upper surface of the via layer 105 may be flat despite a step difference thereunder. The via layer 105 may include an inorganic insulating material or an organic insulating material such as polyacrylates resin, epoxy resin, phenolic resin, polyamides resin, polyimides resin, unsaturated polyesters resin, polyphenylenethers resin, polyphenylenesulfides resin, benzocyclobutene (BCB) or a combination thereof.

The fourth conductive layer 400 may be disposed on the via layer 105. The fourth conductive layer 400 may include a first pixel electrode PXE1, a second pixel electrode PXE2, and a third pixel electrode PXE3. The first pixel electrode PXE1 may include the anode of the light emitting element EMD of the first subpixel PXS1, the second pixel electrode PXE2 may include the anode of the light emitting element EMD of the second subpixel PXS2, and the third pixel electrode PXE3 may include the anode of the light emitting element EMD of the third subpixel PXS3.

The first pixel electrode PXE1 may be disposed adjacent to the right side of the center of the pixel PX. The first pixel electrode PXE1 may be disposed at a position overlapping the first through third data lines 131 through 133. The second pixel electrode PXE2 may be disposed near the center of the pixel PX. The second pixel electrode PXE2 may overlap the first through third data conductive patterns 341 through 343. The third pixel electrode PXE3 may be disposed on the left side of the center of the pixel PX. The third pixel electrode PXE3 may overlap the first power line 120, the reference voltage line 140, and the second voltage line 150. However, the disclosure is not limited thereto.

The first through third pixel electrodes PXE1 through PXE3 may overlap the first through third data conductive patterns 341 through 343, respectively. In the overlapping areas, the first through third pixel electrodes PXE1 through PXE3 may be respectively electrically connected to the first through third data conductive patterns 341 through 343 through contact holes CNT32 through CNT34 penetrating the via layer 105 and the passivation layer 104 to partially expose the first through third data conductive patterns 341 through 343.

A pixel defining layer PDL may be disposed on the fourth conductive layer 400. Openings defined by the pixel defining layer PDL may be provided. Each of the openings may expose a part of any one of the first through third pixel electrodes PXE1 through PXE3.

A light emitting layer EML may be disposed on the first through third pixel electrodes PXE1 through PXE3 exposed by the pixel defining layer PDL. The light emitting layer EML may include an organic layer including an organic material. The organic layer may include an organic light emitting layer and, in some cases, may further include a hole injection/transport layer and/or an electron injection/transport layer as an auxiliary layer for assisting light emission.

A common electrode CME (or a cathode) may be disposed on the light emitting layer EML. The common electrode CME may be connected without distinction between the pixels PX and the subpixels PXS1 through PXS3. The common electrode CME may be a whole-surface electrode disposed over the entire surface without distinction between the pixels PX and the subpixels PXS1 through PXS3. The common electrode CME may be the second electrode, e.g., the cathode of the light emitting element EMD (see FIG. 2).

Each of the pixel electrodes PXE1 through PXE3, the light emitting layer EML, and the common electrode CME may constitute a light emitting element (e.g., an organic light emitting element). Light emitted from the light emitting layer EML may be output upward through the common electrode CME.

An encapsulation film may be further disposed on the common electrode CME. The encapsulation film may include at least one encapsulation layer. For example, the encapsulation layer may include a first inorganic layer, an organic layer, and a second inorganic layer.

Next, the repair circuit DP will be described.

The first conductive layer 100 may further include a repair lower light blocking pattern 160, a repair first power pattern 170, and a repair connection pattern 180. The repair lower light blocking pattern 160, the repair first power pattern 170, and the repair connection pattern 180 may be disposed between the data lines 131 through 133 of two pixels PX adjacent to each other. The repair lower light blocking pattern 160, the repair first power pattern 170, and the repair connection pattern 180 may be disposed in the display area DA but may not overlap the respective pixel electrodes PXE1 through PXE3 of the subpixels PXS1 through PXS3.

The repair lower light blocking pattern 160 may protect a first repair semiconductor pattern DACT1 from external light. The repair lower light blocking pattern 160 may have a patterned shape. The repair lower light blocking pattern 160 may cover a channel region of the first repair semiconductor pattern DACT1 and, by extension, may cover the whole of the first repair semiconductor pattern DACT1.

The repair lower light blocking pattern 160 may be disposed at the center of the repair circuit DP. In other words, the repair lower light blocking pattern 160 may be located at the center of the repair circuit DP in the second direction DR2.

The repair first power pattern 170 may be located on a second side (a lower side) of the repair lower light blocking pattern 160 in the second direction DR2. The repair first power pattern 170 may be disposed in a lower part of the repair circuit DP. The repair first power pattern 170 may overlap the first repair semiconductor pattern DACT1, but the disclosure is not limited thereto.

The repair first power pattern 170 may overlap and intersect the scan line 310, the sensing line 320, and the sub-first power line 330 in plan view. In the overlapping areas, the buffer layer 101 and the interlayer insulating layer 103 may be disposed between the repair first power pattern 170 and the scan line 310, the sensing line 320 and the sub-first power line 330 to insulate these components from each other.

The repair first power pattern 170 may overlap the sub-first power line 330. In the overlapping area, the repair first power pattern 170 may be electrically connected to the sub-first power line 330 by a contact hole CNT35 penetrating the interlayer insulating layer 103 and the buffer layer 101 to expose the repair first power pattern 170. For example, the repair first power pattern 170 may be electrically connected to the first power line 120 through the sub-first power line 330.

The repair connection pattern 180 may be located on a first side (an upper side) of the repair lower light blocking pattern 160 in the second direction DR2. Due to the repair connection pattern 180, a first repair contact pattern DCE1 of two pixels PX adjacent to each other may be separated. Accordingly, the first repair contact pattern DCE1 may be more smoothly electrically connected to any one of the two pixels PX adjacent to each other while being electrically insulated from the other one.

The semiconductor layer SC may further include the first repair semiconductor pattern DACT1 and a second repair semiconductor pattern DACT2. The first repair semiconductor pattern DACT1 and the second repair semiconductor pattern DACT2 may be disposed in the display area DA but may not overlap the respective pixel electrodes PXE1 through PXE3 of the subpixels PXS1 through PXS3.

The first repair semiconductor pattern DACT1 may be an active layer of the first repair transistor DT1, and the second repair semiconductor pattern DACT2 may be an active layer of the second repair transistor DT2. The first repair semiconductor pattern DACT1 and the second repair semiconductor pattern DACT2 may be disposed in the display area DA but may not overlap the respective pixel electrodes PXE1 through PXE3 of the subpixels PXS1 through PXS3.

Each of the first repair semiconductor pattern DACT1 and the second repair semiconductor pattern DACT2 may include a channel region overlapping the gate electrode in the thickness direction (the third direction DR3) and a conducting region located on a side and another side of the channel region. The conducting region may have greater conductivity and lower electrical resistance than the channel region. The conducting region of each of the first repair semiconductor pattern DACT1 and the second repair semiconductor pattern DACT2 may include the source electrode and the drain electrode (or the first source/drain electrode and the second source/drain electrode) of each transistor DT1 or DT2 in an area overlapping the third conductive layer 300.

The first repair semiconductor pattern DACT1 and the second repair semiconductor pattern DACT2 may be disposed on a second side (a lower side) and a first side (an upper side) in the second direction DR2 in the repair circuit DP, respectively.

The second conductive layer 200 may further include a first repair gate conductive pattern 231 and a second repair gate conductive pattern 232. The first repair gate conductive pattern 231 and the second repair gate conductive pattern 232 may be disposed in the display area DA but may not overlap the respective pixel electrodes PXE1 through PXE3 of the subpixels PXS1 through PXS3.

The first repair gate conductive pattern 231 may be disposed at the center of the repair circuit DP. In other words, the first repair conductive pattern 231 may be disposed at the center of the repair circuit DP in the second direction DR2.

The first repair gate conductive pattern 231 and the second repair gate conductive pattern 232 may partially overlap the first repair semiconductor pattern DACT1 and the second repair semiconductor pattern DACT2, respectively. In the overlapping areas, the first repair gate conductive pattern 231 and the second repair gate conductive pattern 232 may include the gate electrodes of the first repair transistor DT1 and the second repair transistor DT2, respectively.

In other words, the first repair gate conductive pattern 231 may overlap a part of the first repair semiconductor pattern DACT1 to include the gate electrode of the first repair transistor DT1 in the overlapping area. The first repair gate conductive pattern 231 may overlap at least the channel region of the first repair semiconductor pattern DACT1.

The first repair gate conductive pattern 231 may overlap a repair data conductive pattern 350 and may include the first electrode of the repair capacitor DCST in the overlapping area. For example, the first electrode of the repair capacitor DCST may be formed of the first repair gate conductive pattern 231 itself or may be formed of a part extending from the gate electrode of the first repair transistor DT1.

The first repair gate conductive pattern 231 may include an area protruding in the second direction DR2 from an area overlapping the repair data conductive pattern 350. The protruding area may overlap the first repair contact pattern DCE1 and may be electrically connected to the first repair contact pattern DCE1. For example, the first repair gate conductive pattern 231 may be electrically connected to the second repair semiconductor pattern DACT2 through the first repair contact pattern DCE1.

The second repair gate conductive pattern 232 may be disposed on a first side of the first repair gate conductive pattern 231 in the second direction DR2. The second repair gate conductive pattern 232 may be disposed on a first side (an upper side) of the repair circuit DP.

The second repair gate conductive pattern 232 may overlap the scan line 310. In the overlapping area, the second repair gate conductive pattern 232 may be electrically connected to the scan line 310 through a contact hole CNT36 penetrating the interlayer insulating layer 103 to expose the second repair gate conductive pattern 232.

The second repair gate conductive pattern 232 may extend from the area overlapping the scan line 310 toward the second side in the second direction DR2 and may intersect the repair connection pattern 180 to overlap at least a part of the second repair semiconductor pattern DACT2. The second repair gate conductive pattern 232 may include the gate electrode of the second repair transistor DT2 in the overlapping area. The second repair gate conductive pattern 232 may overlap at least the channel region of the second repair semiconductor pattern DACT2.

The third conductive layer 300 may further include the repair data conductive pattern 350 and first through fourth repair contact patterns DCE1 through DCE4. The repair data conductive pattern 350 and the first through fourth repair contact patterns DCE1 through DCE4 may be disposed in the display area DA but may not overlap the respective pixel electrodes PXE1 through PXE3 of the subpixels PXS1 through PXS3.

The repair data conductive pattern 350 may overlap the first repair semiconductor pattern DACT1. In the overlapping area, the repair data conductive pattern 350 may be electrically connected to the first repair semiconductor pattern DACT1 through a contact hole CNT37 penetrating the interlayer insulating layer 103 to expose a part of the first repair semiconductor pattern DACT1. The repair data conductive pattern 350 may include the second source/drain electrode of the second repair transistor DT2 of the repair circuit DP.

The repair data conductive pattern 350 may overlap the first repair gate conductive pattern 231. In the overlapping area, the repair data conductive pattern 350 may include the second electrode of the repair capacitor DCST. For example, in a part not overlapping the first repair semiconductor pattern DACT1 and overlapping the first repair gate conductive pattern 231, the repair data conductive pattern 350 may include the second electrode of the repair capacitor DCST.

The repair data conductive pattern 350 may protrude in the second direction DR2 from the area overlapping the first repair gate conductive pattern 231. The protruding area may overlap a repair circuit connection pattern 410, and a fourth recess pattern RC4 may be disposed in the overlapping area. This will be described in detail later.

The first repair contact pattern DCE1 may be disposed on a first side of the repair data conductive pattern 350 in the second direction DR2. The first repair contact pattern DCE1 may overlap the second repair semiconductor pattern DACT2. In the overlapping area, the first repair contact pattern DCE1 may contact the second repair semiconductor pattern DACT2 through a contact hole CNT38 penetrating the interlayer insulating layer 103 to expose the second repair semiconductor pattern DACT2. The first repair contact pattern DCE1 may overlap the first repair gate conductive pattern 231. In the overlapping area, the first repair contact pattern DCE1 may contact the first repair gate conductive pattern 231 through a contact hole CNT39 penetrating the interlayer insulating layer 103 to expose the first repair gate conductive pattern 231.

For example, the second repair semiconductor pattern DACT2 may be electrically connected to the first repair gate conductive pattern 231 through the first repair contact pattern DCE1. The first repair contact pattern DCE1 may include the second source/drain electrode of the second repair transistor DT2.

The second repair contact pattern DCE2 may be disposed on a second side (a right side) of the first repair contact pattern DCE1 in the first direction DR1. The second repair contact pattern DCE2 may be disposed on the second side of the first repair contact pattern DCE1 in the first direction DR1 with the second repair gate conductive pattern 232 interposed therebetween. The second repair contact pattern DCE2 may overlap the second repair semiconductor pattern DACT2. In the overlapping area, the second repair contact pattern DCE2 may contact the second repair semiconductor pattern DACT2 through a contact hole CNT40 penetrating the interlayer insulating layer 103 to expose the second repair semiconductor pattern DACT2. The second repair contact pattern DCE2 may overlap the repair connection pattern 180. In the overlapping area, the second repair contact pattern DCE2 may contact the repair connection pattern 180 through a contact hole CNT41 penetrating the interlayer insulating layer 103 and the buffer layer 101 to expose the repair connection pattern 180.

For example, the second repair semiconductor pattern DACT2 may be electrically connected to the repair connection pattern 180 through the second repair contact pattern DCE2. The second repair contact pattern DCE2 may include the first source/drain electrode of the second repair transistor DT2.

The third repair contact pattern DCE3 (or a second repair circuit connection pattern) may be disposed on a first side of the first repair contact pattern DCE1 in the second direction DR2. The third repair contact pattern DCE3 may overlap the repair connection pattern 180.

In the overlapping area, the third repair contact pattern DCE3 may contact the repair connection pattern 180 through a contact hole penetrating the interlayer insulating layer 103 and the buffer layer 101 to expose the repair connection pattern 180.

The third repair contact pattern DCE3 may extend to the first side in the first direction DR1 from a part contacting the repair connection pattern 180 and may intersect the first through third data lines 131 through 133 of the pixel PX disposed on a first side of the repair circuit DP in the first direction DR1. The third repair contact pattern DCE3 may overlap the first through third data lines 131 through 133, and first through third recess patterns RC1 through RC3 may be disposed in the overlapping areas, respectively.

The first through third recess patterns RC1 through RC3 will be described in more detail with further reference to FIG. 9.

Figure 9:
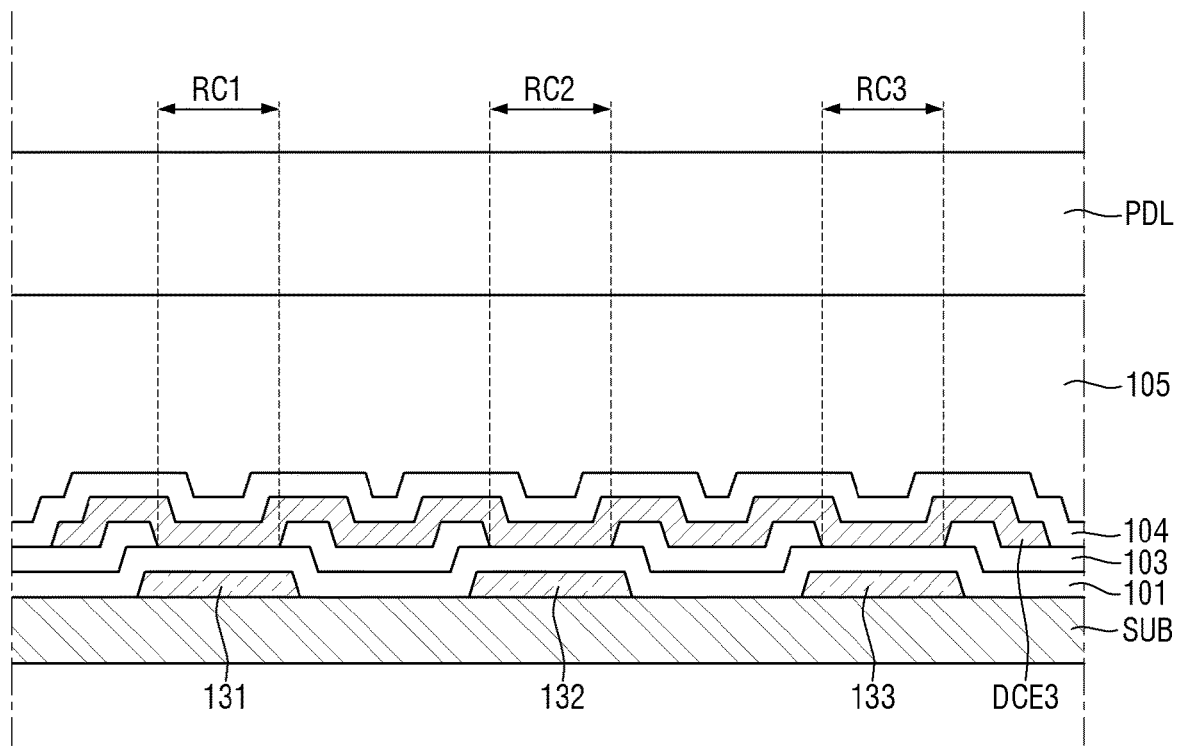
FIG. 9 is a schematic cross-sectional view of an area in which first through third recess patterns may be disposed according to an embodiment.

FIG. 9 is a schematic cross-sectional view of an area in which first through third recess patterns RC1 through RC3 may be disposed according to an embodiment.

Referring further to FIG. 9, the first through third recess patterns RC1 through RC3 may be defined by removing at least a part of an insulating layer disposed between each of the first through third data lines 131 through 133 and the third repair contact pattern DCE3. For example, the first through third recess patterns RC1 through RC3 may be defined by removing the interlayer insulating layer 103. However, the disclosure is not limited thereto, and the first through third recess patterns RC1 through RC3 may also be defined by removing the buffer layer 101 rather than the interlayer insulating layer 103 or may be defined by removing the interlayer insulating layer 103 and a part of an upper part of the buffer layer 101.

Although the first through third recess patterns RC1 through RC3 are illustrated as through holes penetrating the interlayer insulating layer 103 in the thickness direction, the disclosure is not limited thereto. The first through third recess patterns RC1 through RC3 may also be shaped like grooves formed by partially removing an upper part of the interlayer insulating layer 103.

The third repair contact pattern DCE3 may be disposed in the first through third recess patterns RC1 through RC3. Due to the first through third recess patterns RC1 through RC3, a distance between the third repair contact pattern DCE3 and each of the first through third data lines 131 through 133 in the thickness direction (the third direction DR3) may be reduced. Accordingly, in a process of repairing the display device, which will be described later, welding between the third repair contact pattern DCE3 and the first through third data lines 131 through 133 may be performed more smoothly.

Before the welding may be performed, the third repair contact pattern DCE3 may be electrically insulated from each of the first through third data lines 131 through 133 by at least one insulating layer interposed therebetween in an area in which the third repair contact pattern DCE3 overlaps each of the first through third data lines 131 through 133.

Referring again to FIGS. 2 through 8, the fourth repair contact pattern DCE4 may be disposed on a second side (a lower side) of the repair data conductive pattern 350 in the second direction DR2. The fourth repair contact pattern DCE4 may overlap the repair first power pattern 170. In the overlapping area, the fourth repair contact pattern DCE4 may contact the repair first power pattern 170 through a contact hole CNT43 penetrating the interlayer insulating layer 103 and the buffer layer 101 to expose the repair first power pattern 170.

For example, the repair first power pattern 170 and the first repair semiconductor pattern DACT1 may be electrically connected by the fourth repair contact pattern DCE4. The fourth repair contact pattern DCE4 may include the first source/drain electrode of the first repair transistor DT1.

The fourth conductive layer 400 may further include the repair circuit connection pattern 410 (or a first repair circuit connection pattern). The repair circuit connection pattern 410 may overlap the second source/drain electrode of the first transistor T1 of each of the first through third subpixels PXS1 through PXS3 and may overlap the second source/drain electrode of the first repair transistor DT1.

The repair circuit connection pattern 410 may overlap the repair data conductive pattern 350. In other words, the repair data conductive pattern 350 may include an area protruding from an area overlapping the gate conductive pattern 231 toward the first side in the second direction DR2, and the repair circuit connection pattern 410 may overlap the protruding area of the repair data conductive pattern 350.

In the overlapping area, the fourth recess pattern RC4 may be disposed.

The fourth recess pattern RC4 will be described in more detail with further reference to FIG. 10.

Figure 10:
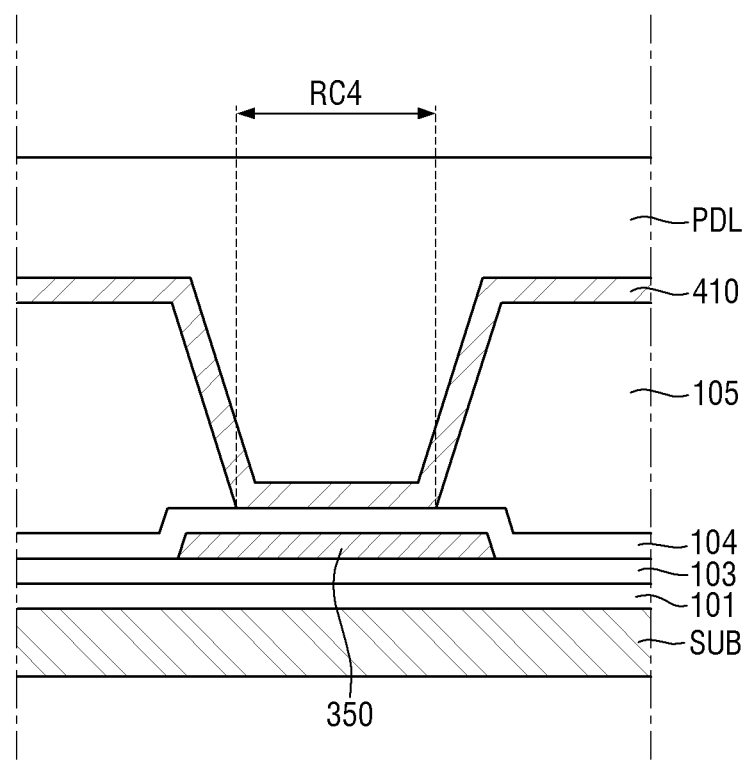
FIG. 10 is a schematic cross-sectional view of an area in which a fourth recess pattern is disposed according to an embodiment.
Figure 10:
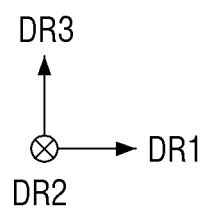

FIG. 10 is a schematic cross-sectional view of an area in which a fourth recess pattern RC4 may be disposed according to an embodiment.

Referring further to FIG. 10, the fourth recess pattern RC4 may be defined by removing at least a part of an insulating layer disposed between the repair data conductive pattern 350 and the repair circuit connection pattern 410. For example, the fourth recess pattern RC4 may be defined by removing the via layer 105. However, the disclosure is not limited thereto, and the fourth recess pattern RC4 may also be defined by removing the passivation layer 104 rather than the via layer 105 or may be defined by removing the via layer 105 and a part of an upper part of the passivation layer 104.

Although the fourth recess pattern RC4 is illustrated as a through hole penetrating the via layer 105 in the thickness direction, the disclosure is not limited thereto. The fourth recess pattern RC4 may also be shaped like a groove formed by partially removing an upper part of the via layer 105.

The repair circuit connection pattern 410 may be disposed in the fourth recess pattern RC4. Due to the fourth recess pattern RC4, a distance between the repair circuit connection pattern 410 and the repair data conductive pattern 350 in the thickness direction (the third direction DR3) may be reduced. Accordingly, in the process of repairing the display device, which will be described later, welding between the repair circuit connection pattern 410 and the repair data conductive pattern 350 may be performed more smoothly.

Before the welding may be performed, the repair circuit connection pattern 410 may be electrically insulated from the repair data conductive pattern 350 by at least one insulating layer interposed therebetween in an area in which the repair circuit connection pattern 410 overlaps the repair data conductive pattern 350.

Referring again to FIGS. 2 through 8, the repair circuit connection pattern 410 may extend from the area in which the fourth recess pattern RC4 may be disposed toward the first side or a second side in the first direction DR1. The repair circuit connection pattern 410 may extend toward each of the pixels PX disposed on the first side and a second side of the repair circuit DP in the first direction DR1. The repair circuit connection pattern 410 may extend across the first through third data lines 131 through 133. The repair circuit connection pattern 410 may overlap the first through third data lines 131 through 133. In the overlapping areas, the repair circuit connection pattern 410 and the first through third data lines 131 through 133 may be insulated from each other by the via layer 105, the passivation layer 104, the interlayer insulating layer 103, and the buffer layer 101.

The repair circuit connection pattern 410 may not overlap the first through third pixel electrodes PXE1 through PXE3 in the pixel PX and may overlap the fourth through sixth data conductive patterns 344 through 346. In other words, the repair circuit connection pattern 410 may extend from the area in which the fourth recess pattern RC4 may be disposed, bypass the first and second pixel electrodes PXE1 and PXE2, and extend to between the second pixel electrode PXE2 and the third pixel electrode PXE3. The repair circuit connection pattern 410 may bypass the first and second pixel electrodes PXE1 and PXE2 around a first side (an upper side) of each of the first and second pixel electrodes PXE1 and PXE2 in the second direction DR2, but the disclosure is not limited thereto. The repair circuit connection pattern 410 may overlap a protruding area of each of the fourth through sixth data conductive patterns 344 through 346 between the second pixel electrode PXE2 and the third pixel electrode PXE3, but the disclosure is not limited thereto.

In the areas in which the repair circuit connection pattern 410 overlaps the fourth through sixth data conductive patterns 344 through 346, fifth through seventh recess patterns RC5 through RC7 may be disposed.

The fifth through seventh recess patterns RC5 through RC7 will be described in more detail with further reference to FIG. 11.

Figure 11:
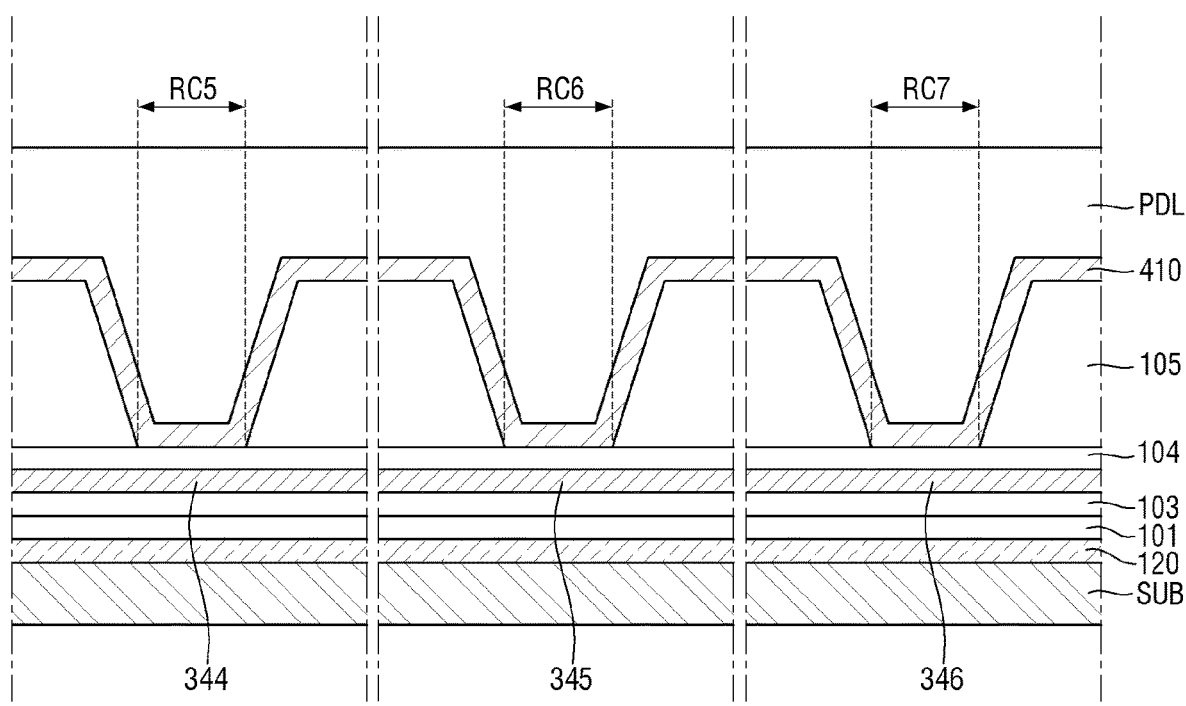
FIG. 11 is a schematic cross-sectional view of an area in which fifth through seventh recess patterns may be disposed according to an embodiment.

FIG. 11 is a schematic cross-sectional view of an area in which fifth through seventh recess patterns RC5 through RC7 may be disposed according to an embodiment.

Referring further to FIG. 11, the fifth through seventh recess patterns RC5 through RC7 may be defined by removing at least a part of an insulating layer disposed between each of the fourth through sixth data conductive patterns 344 through 346 and the repair circuit connection pattern 410. For example, the fifth through seventh recess patterns RC5 through RC7 may be defined by removing the via layer 105. However, the disclosure is not limited thereto, and the fifth through seventh recess patterns RC5 through RC7 may also be defined by removing the passivation layer 104 rather than the via layer 105 or may be defined by removing the via layer 105 and a part of the upper part of the passivation layer 104.

Although the fifth through seventh recess patterns RC5 through RC7 are illustrated as through holes penetrating the via layer 105 in the thickness direction, the disclosure is not limited thereto. The fifth through seventh recess patterns RC5 through RC7 may also be shaped like grooves formed by partially removing the upper part of the via layer 105.

The repair circuit connection pattern 410 may be disposed in the fifth through seventh recess patterns RC5 through RC7. Due to the fifth through seventh recess patterns RC5 through RC7, a distance between the repair circuit connection pattern 410 and each of the fourth through sixth data conductive patterns 344 through 346 in the thickness direction (the third direction DR3) may be reduced. Accordingly, in the process of repairing the display device, which will be described later, welding between the repair circuit connection pattern 410 and the fourth through sixth data conductive patterns 344 through 346 may be performed more smoothly.

Before the welding may be performed, the repair circuit connection pattern 410 may be electrically insulated from each of the fourth through sixth data conductive patterns 344 through 346 by at least one insulating layer interposed therebetween in an area in which the repair circuit connection pattern 410 overlaps each of the fourth through sixth data conductive patterns 344 through 346.

Referring again to FIGS. 2 through 8, the repair circuit connection pattern 410 extending toward the first side and the second side in the first direction DR1 may be substantially symmetrical to each other with respect to the fourth recess pattern RC4. In other words, a part of the repair circuit connection pattern 410 which may extend from the fourth recess pattern RC4 toward the first side in the first direction DR1 and another part of the repair circuit connection pattern 410 which may extend toward the second side in the first direction DR1 may be symmetrical to each other in the first direction DR1. For example, in plan view, a part of the repair circuit connection pattern 410 which may extend from the fourth recess pattern RC4 toward the first side in the first direction DR1 and another part of the repair circuit connection pattern 410 which may extend toward the second side in the first direction DR1 may be symmetrical to each other with respect to an imaginary line extending from the fourth recess pattern RC4 in the second direction DR2.

The pixels PX adjacent to each other with the repair circuit DP interposed therebetween may be disposed symmetrically to each other. For example, two pixels PX adjacent to each other in the first direction DR1 with the repair circuit DP interposed therebetween may be symmetrical to each other in the first direction DR1 with respect to an imaginary line extending in the second direction DR2 in plan view. For example, arrangements of the respective semiconductor layers SC and conductive layers 100, 200, 300 and 400 of the two pixels PX may be symmetrical to each other. The repair circuit DP and two pixels PX adjacent to each other with the repair circuit DP interposed therebetween may form a minimum repeat unit. For example, the repair circuit DP and two pixels PX adjacent to each other with the repair circuit DP interposed therebetween may be repeatedly arranged in the first direction DR1 and the second direction DR2 in plan view. However, the disclosure is not limited thereto.

Since the repair circuit DP may be disposed between the pixels PX adjacent to each other, even if a defect occurs in any one of the two pixels PX adjacent to the repair circuit DP, the repair circuit DP can repair the defective pixel PX. Therefore, the repair circuit DP may not be disposed between each pixel PX, and an area in which the repair circuit DP is disposed may be minimized. Accordingly, more pixels PX can be disposed in the same area of the display device. Further, high resolution of the display device can be realized.

Since the repair circuit DP may be disposed in the display area DA, a pixel PX closest to the repair circuit DP may be repaired, and a length of a wiring connecting the repair circuit DP and the repaired pixel may be minimized. Accordingly, a resistive-capacitive (RC) delay due to the length of the wiring connecting the repair circuit DP and the repaired pixel can be suppressed or prevented.

A method of repairing a display device according to an embodiment will now be described with reference to FIGS. 12 through 17. FIGS. 12 through 17 illustrate a method of repairing a defect occurring, for example, in the first transistor T1 or the storage capacitor CST of the first subpixel PXS1 of a pixel PX. However, the disclosure is not limited thereto, and the following description may be applicable not only to the first subpixel PXS1 but also to the second subpixel PXS2 and the third subpixel PXS3.

Figure 12:
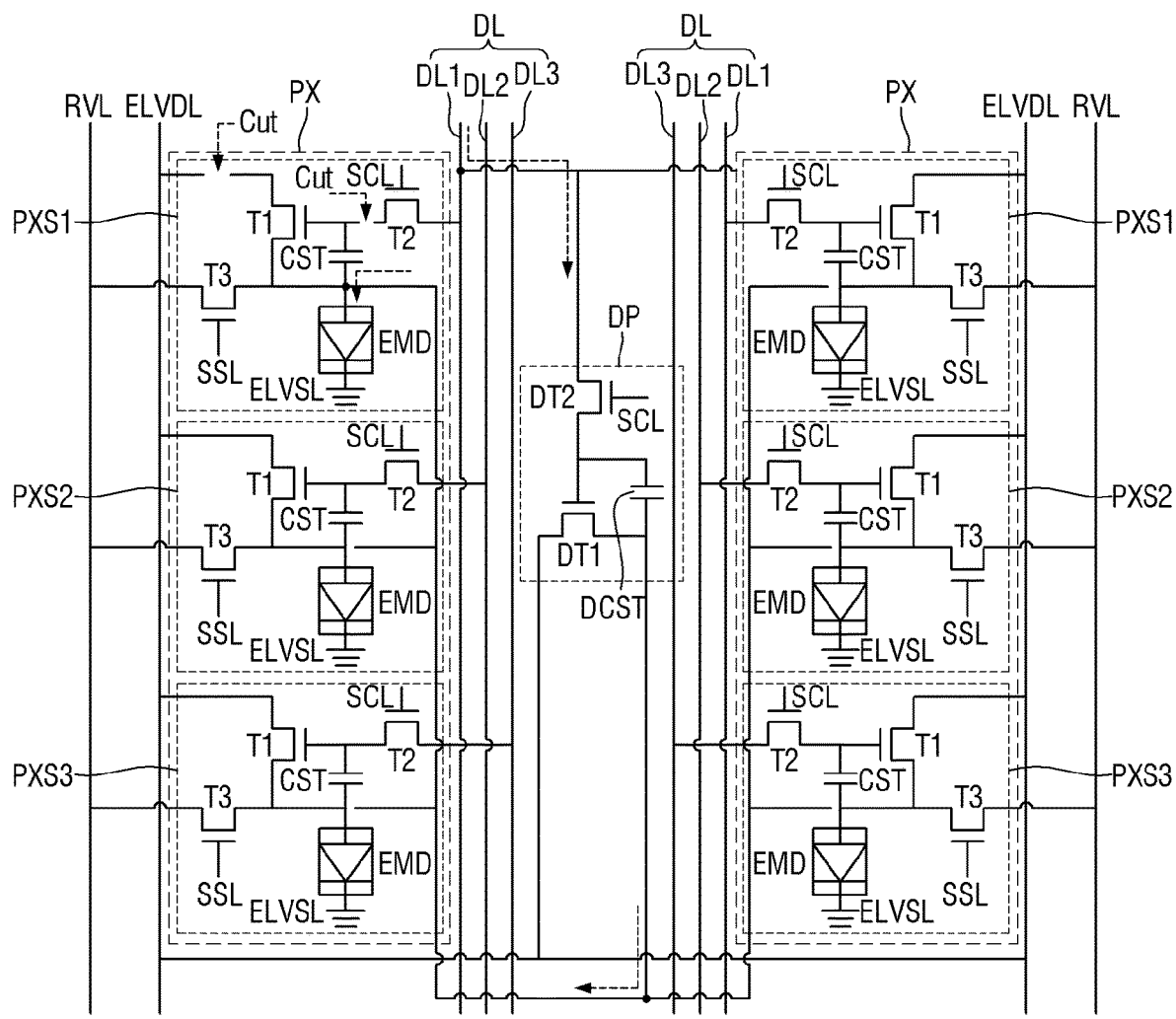
FIG. 12 is a schematic diagram of an equivalent circuit of pixels and a repair circuit for explaining a method of repairing a display device according to an embodiment.
Figure 12:
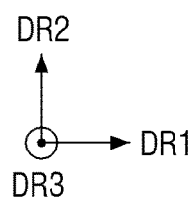

FIG. 12 is a schematic diagram of an equivalent circuit of pixels PX and a repair circuit DP for explaining a method of repairing a display device according to an embodiment.

Referring to FIG. 12, in case that a defect occurs in the first transistor T1 or the storage capacitor CST of the first subpixel PXS1, the first transistor T1 and the first power line ELVDL may be cut, and the second transistor T2 and the storage capacitor CST (or the gate electrode of the first transistor T1) may be cut. Accordingly, the light emitting element EMD of the first subpixel PXS1 may not be affected by the defective first transistor T1 or storage capacitor CST of the first subpixel PXS1.

The first repair transistor DT1 and the repair capacitor DCST of the repair circuit DP may be electrically connected to the anode of the light emitting element EMD of the first subpixel PXS1. The second repair transistor DT2 of the repair circuit DP may be electrically connected to the first data line DLL.

The first power supply voltage applied to the first repair transistor DT1 may pass through the first repair transistor DT1 to reach the light emitting element EMD of the first subpixel PXS1. The second repair transistor DT2 may receive a data signal from the first data line DL1 and transmit the data signal to the gate electrode of the first repair transistor DT1. Therefore, even if a defect occurs in at least one of the first transistor T1 and the storage capacitor CST of the first subpixel PXS1, the light emitting element EMD of the first subpixel PXS1 may smoothly operate through the first repair transistor DT1, the second repair transistor DT2 and the repair capacitor DST of the repair circuit DP and the third transistor T3 of the first subpixel PXS1.

Even if a defect occurs in a pixel PX, it can be repaired through the repair circuit DP. Accordingly, this can improve the yield of non-defective display devices and reduce process cost.

Figure 13:
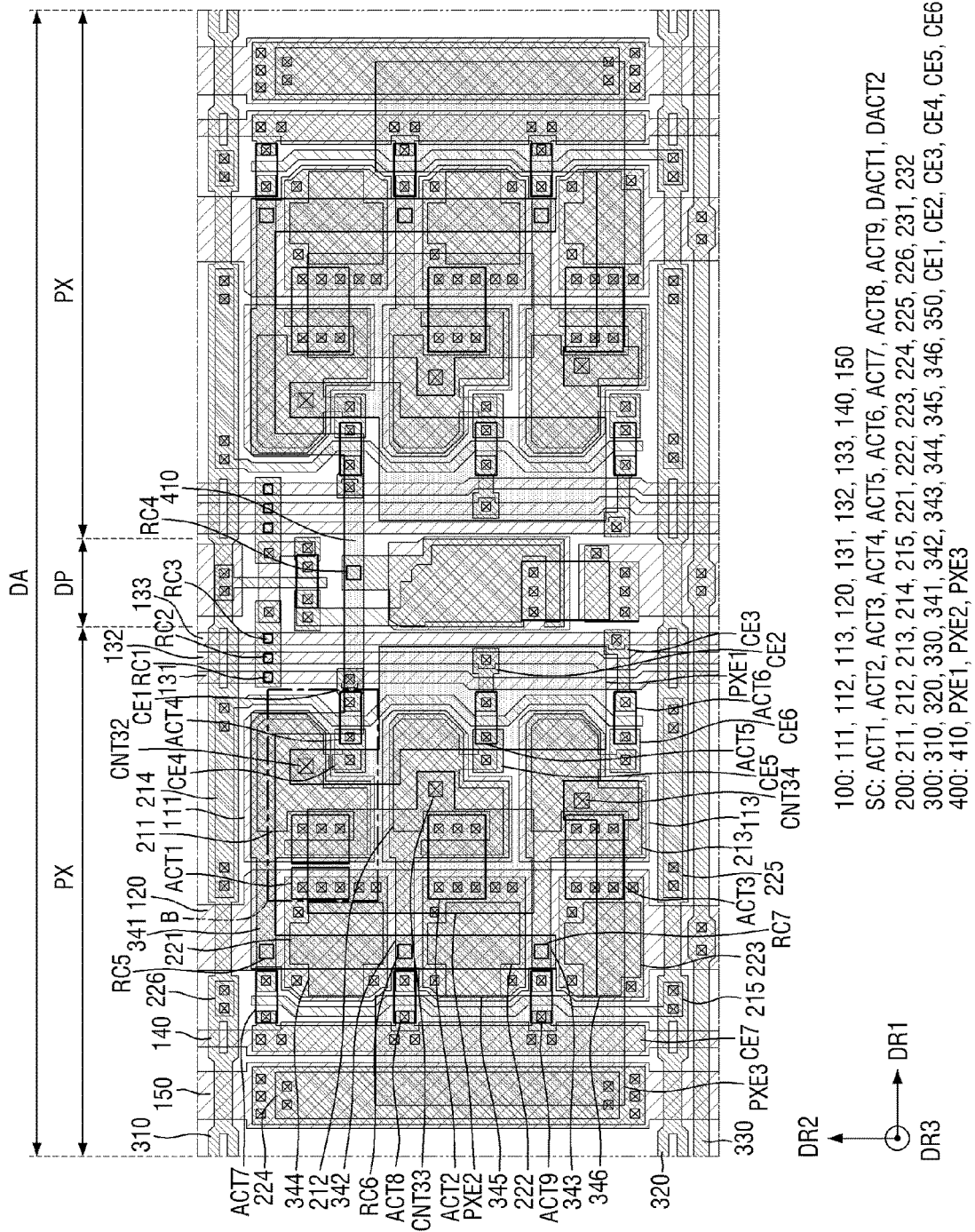
FIG. 13 is a schematic layout view of the pixels and the repair circuit for explaining the method of repairing the display device according to an embodiment.
Figure 14:
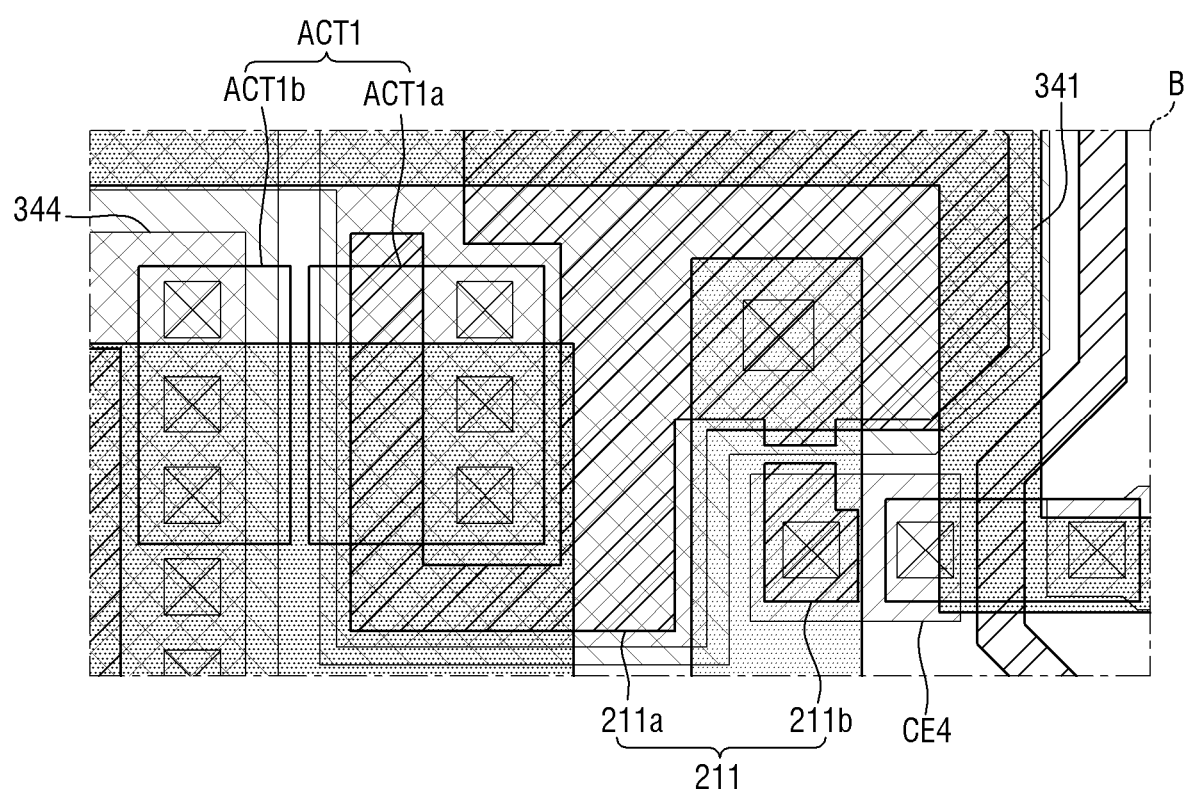
FIG. 14 is an enlarged schematic view of area B of FIG. 13.

FIG. 13 is a schematic layout view of the pixels PX and the repair circuit DP for explaining the method of repairing the display device according to an embodiment. FIG. 14 is an enlarged schematic view of area B of FIG. 13.

Referring to FIGS. 12 through 14, each of the first semiconductor pattern ACT1 and the first gate conductive pattern 211 of a pixel PX may be cut into at least two parts, and the two parts may be separated and electrically isolated from each other.

Specifically, the first semiconductor pattern ACT1 may be cut into at least two parts. The first semiconductor pattern ACT1 may be divided into a first area ACT1a overlapping the first data conductive pattern 341 and a second area ACT1b overlapping the fourth data conductive pattern 344. The first area ACT1a and the second area ACT1b may be separated and electrically isolated from each other.

In a part where the first semiconductor pattern ACT1 may be cut into the first area ACT1a and the second area ACT1b, other elements may not be disposed in plan view. It may be possible to suppress or prevent other elements from being damaged by a laser irradiated to the first semiconductor pattern ACT1 in case that the cutting of the first semiconductor pattern ACT1 is performed using the laser or the like.

The first gate conductive pattern 211 may be cut into at least two parts. The first gate conductive pattern 211 may be divided into a first area 211a overlapping the first data conductive pattern 341 and a second area 211b overlapping the fourth contact pattern CE4. The first area 211a and the second area 211b may be separated and electrically isolated from each other.

In a part where the first gate conductive pattern 211 may be cut into the first area 211a and the second area 211b, other elements may not be disposed in plan view. It may be possible to suppress or prevent other elements from being damaged by a laser irradiated to the first gate conductive pattern 211 in case that the cutting of the first gate conductive pattern 211 is performed using the laser or the like.

Accordingly, the first power line 120 and the second area ACT1b of the first semiconductor pattern ACT1 may be electrically isolated from each other, and the first data line 131 and the first area 211a of the first gate conductive pattern 211 may be electrically isolated from each other.

The first power line 120 may be electrically connected to the first repair transistor DT1, and the first repair transistor DT1 may be electrically connected to the first data conductive pattern 341 through the repair circuit connection pattern 410. The first data line 131 may be electrically connected to the second repair transistor DT2 through the third repair contact pattern DCE3.

Figure 16:
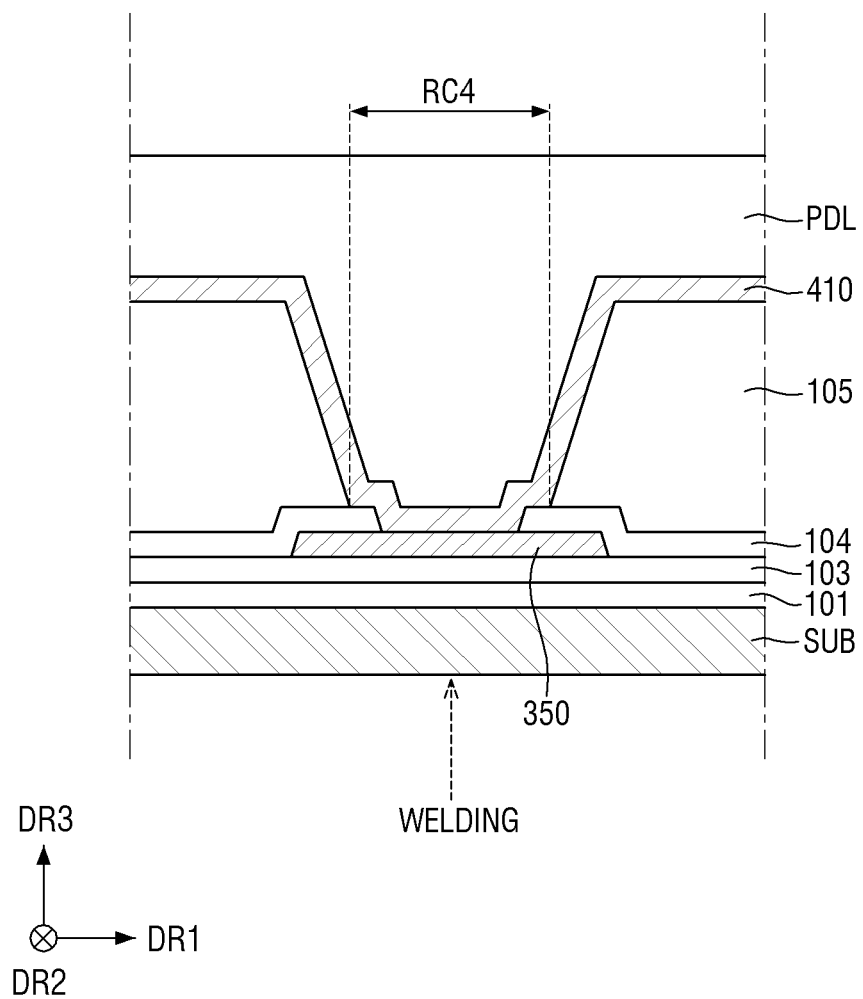
FIG. 16 is a schematic cross-sectional view of an area in which a fourth recess pattern may be disposed, for explaining the method of repairing the display device according to an embodiment.
Figure 17:
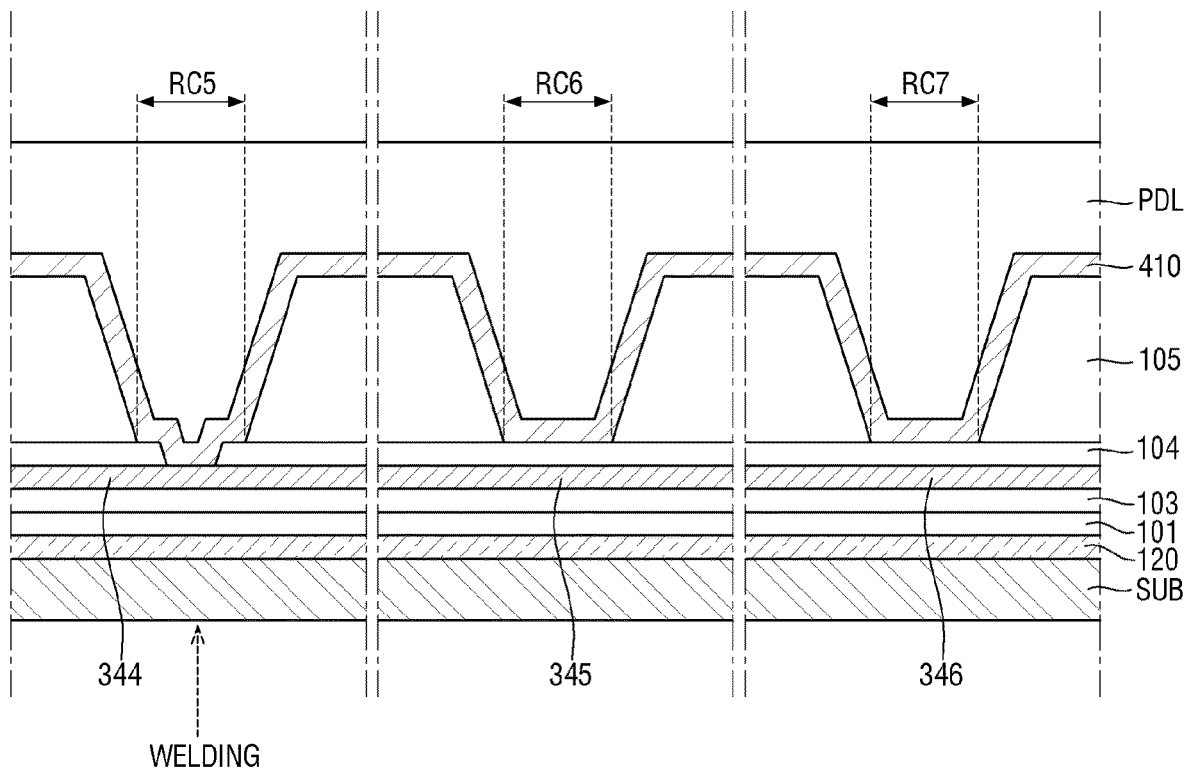
FIG. 17 is a schematic cross-sectional view of an area in which fifth through seventh recess patterns may be disposed, for explaining the method of repairing the display device according to an embodiment.

This will be described in more detail with further reference to FIGS. 15 through 17.

Figure 15:
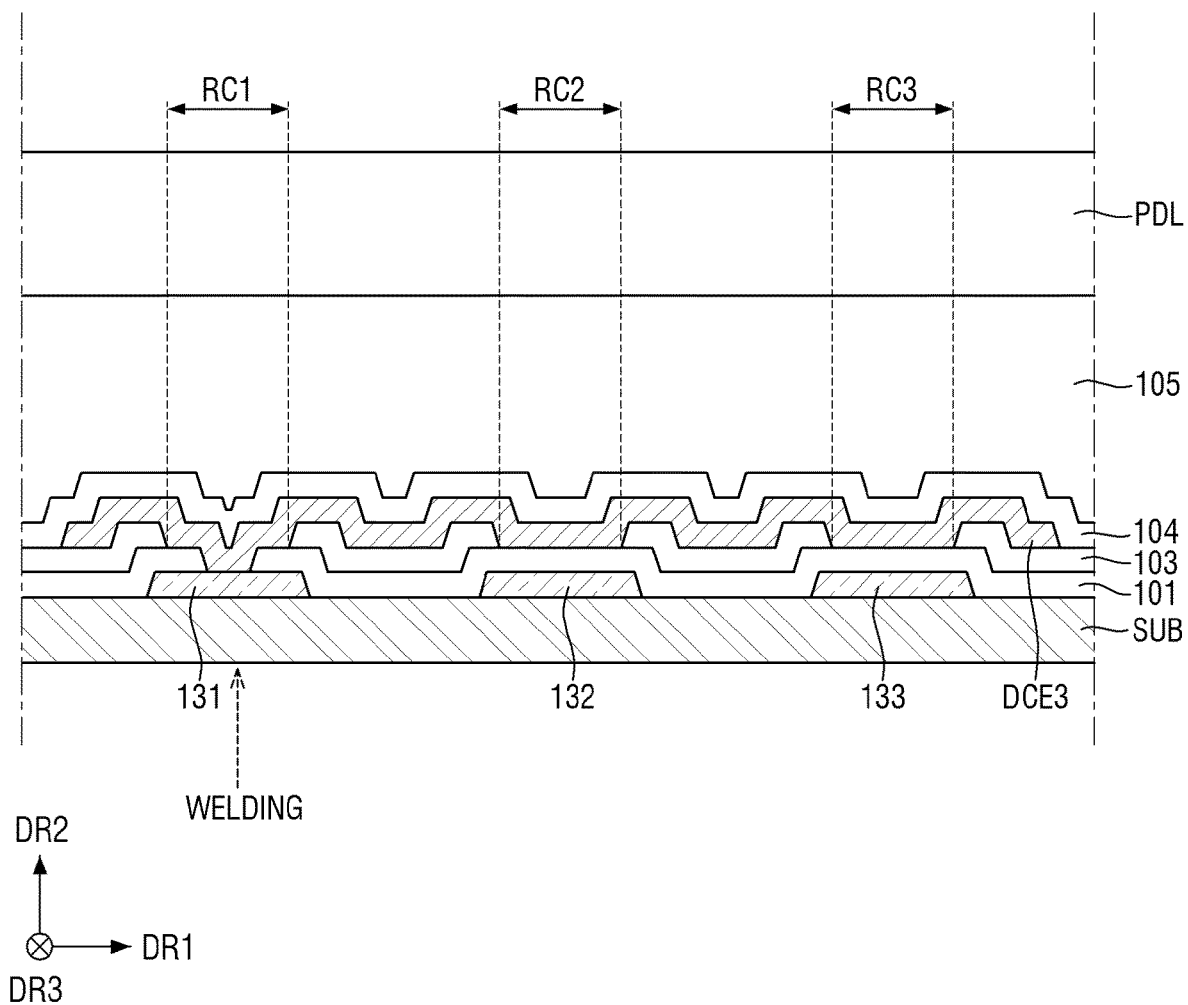
FIG. 15 is a schematic cross-sectional view of an area in which first through third recess patterns may be disposed, for explaining the method of repairing the display device according to an embodiment.

FIG. 15 is a cross-sectional view of an area in which first through third recess patterns RC1 through RC3 may be disposed, for explaining the method of repairing the display device according to the embodiment. FIG. 16 is a schematic cross-sectional view of an area in which a fourth recess pattern RC4 may be disposed, for explaining the method of repairing the display device according to the embodiment. FIG. 17 is a schematic cross-sectional view of an area in which fifth through seventh recess patterns RC5 through RC7 may be disposed, for explaining the method of repairing the display device according to the embodiment.

Referring to FIGS. 12 through 17, the repair data conductive pattern 350 may be electrically connected to the repair circuit connection pattern 410. Welding may be performed at a position where the fourth recess pattern RC4 may be disposed. The welding may be performed through a laser, but the disclosure is not limited thereto. In case that the welding is performed by a laser, an area to which the laser may be irradiated may overlap the position where the fourth recess pattern RC4 may be disposed. In other words, in the area in which the fourth recess pattern RC4 may be disposed, a laser may be irradiated to an insulating layer (e.g., the passivation layer 104) disposed between the repair data conductive pattern 350 and the repair circuit connection pattern 410. After the welding is completed, the repair data conductive pattern 350 and the repair circuit connection pattern 410 may contact each other and may be physically and/or electrically connected to each other. The area in which the repair data conductive pattern 350 and the repair circuit connection pattern 410 contact each other may at least partially overlap the area in which the fourth recess pattern RC4 may be formed.

For example, after the welding may be completed, the repair data conductive pattern 350 and the repair circuit connection pattern 410 may contact each other through a contact hole penetrating the insulating layer (e.g., the passivation layer 104) disposed between the repair data conductive pattern 350 and the repair circuit connection pattern 410 to expose the repair data conductive pattern 350, but the disclosure is not limited thereto. The contact hole may overlap at least a part of the fourth recess pattern RC4.

The first gate conductive pattern 211 may be electrically connected to the repair circuit connection pattern 410. Welding may be performed at a position where the fifth recess pattern RC5 may be disposed. The welding may be performed through a laser, but the disclosure is not limited thereto. In case that the welding is performed by a laser, an area to which the laser may be irradiated may overlap the position where the fifth recess pattern RC5 may be disposed. In other words, in the area in which the fifth recess pattern RC5 may be disposed, a laser may be irradiated to an insulating layer (e.g., the passivation layer 104) disposed between the first gate conductive pattern 211 and the repair circuit connection pattern 410. After the welding may be completed, the first gate conductive pattern 211 and the repair circuit connection pattern 410 may contact each other and may be physically and/or electrically connected to each other. The area in which the first gate conductive pattern 211 and the repair circuit connection pattern 410 contact each other may at least partially overlap the area in which the fifth recess pattern RC5 may be formed.

For example, after the welding may be completed, the first gate conductive pattern 211 and the repair circuit connection pattern 410 may contact each other through a contact hole penetrating the insulating layer (e.g., the passivation layer 104) disposed between the first gate conductive pattern 211 and the repair circuit connection pattern 410 to expose the first gate conductive pattern 211, but the disclosure is not limited thereto. The contact hole may overlap at least a part of the fifth recess pattern RC5.

Accordingly, through the repair circuit connection pattern 410, the repair data conductive pattern 350 may be electrically connected to the first gate conductive pattern 211, and the first repair transistor DT1 and the first pixel electrode PXE1 of the first subpixel PXS1 may be electrically connected to each other.

The third repair contact pattern DCE3 may be electrically connected to the first data line DL1. Welding may be performed at a position where the first recess pattern RC1 may be disposed. The welding may be performed through a laser, but the disclosure is not limited thereto. In case that the welding is performed by a laser, an area to which the laser may be irradiated may overlap the position where the first recess pattern RC1 may be disposed. In other words, in the area in which the first recess pattern RC1 may be disposed, a laser may be irradiated to an insulating layer (e.g., the buffer layer 101) disposed between the third repair contact pattern DCE3 and the first data line 131. After the welding may be completed, the third repair contact pattern DCE3 and the first data line 131 may contact each other and may be physically and/or electrically connected to each other. The area in which the third repair contact pattern DCE3 and the first data line 131 contact each other may at least partially overlap the area in which the first recess pattern RC1 may be formed.

For example, after the welding may be completed, the third repair contact pattern DCE3 and the first data line 131 may contact each other through a contact hole penetrating the insulating layer (e.g., the buffer layer 101) disposed between the third repair contact pattern DCE3 and the first data line 131 to expose the first data line 131, but the disclosure is not limited thereto. The contact hole may overlap at least a part of the first recess pattern RC1.

Accordingly, through the third repair contact pattern DCE3, the repair connection pattern 180 may be electrically connected to the first data line 131, and the second repair transistor DT2 and the first data line 131 may be electrically connected to each other.

Hereinafter, even more embodiments will be described. In the following embodiments, a description of the same elements as those of one or more of the above-described embodiments will be omitted or given briefly, and differences will be described.

Figure 18:
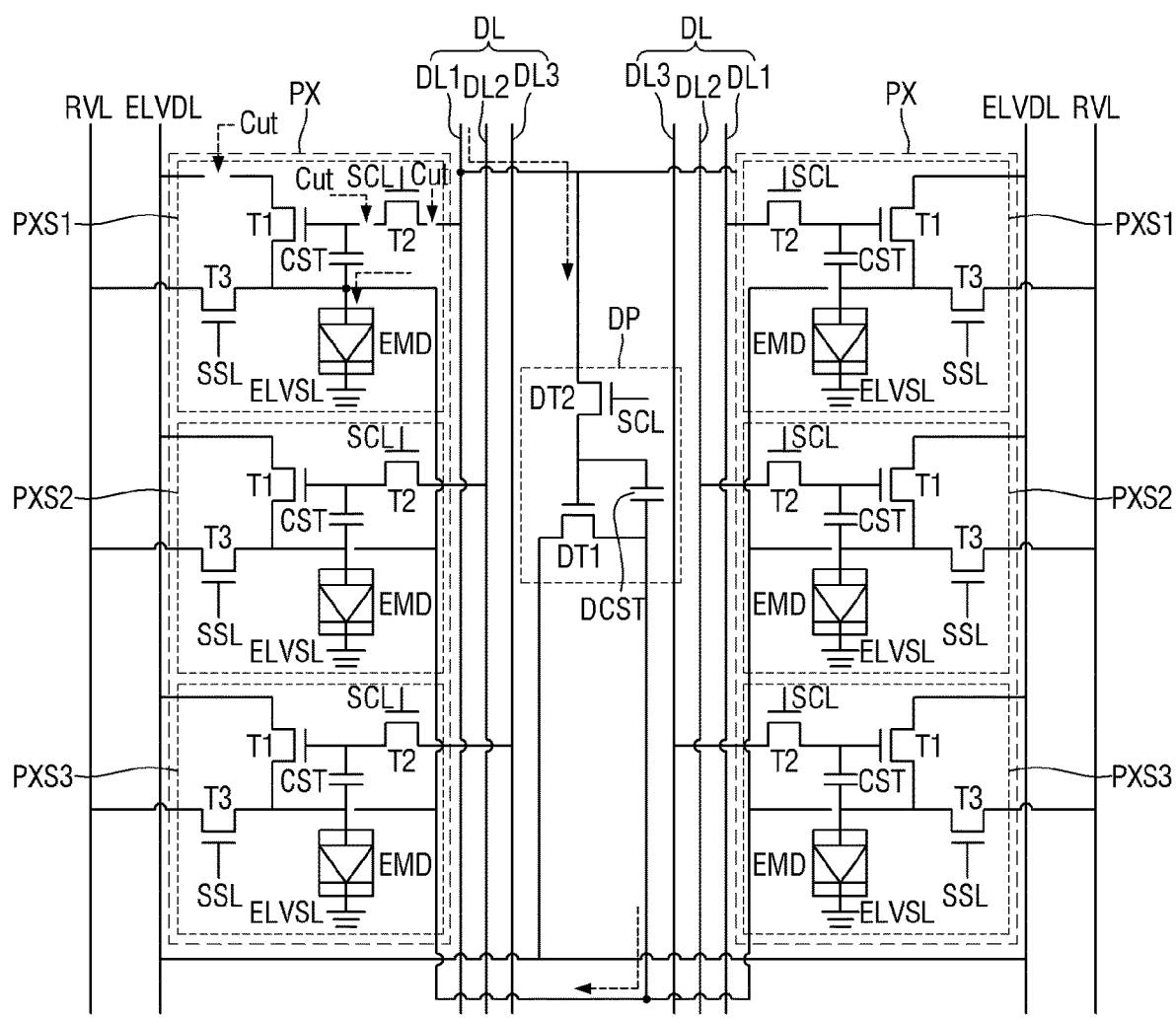
FIG. 18 is a schematic diagram of an equivalent circuit of pixels and a repair circuit for explaining a method of repairing a display device according to an embodiment.
Figure 19:
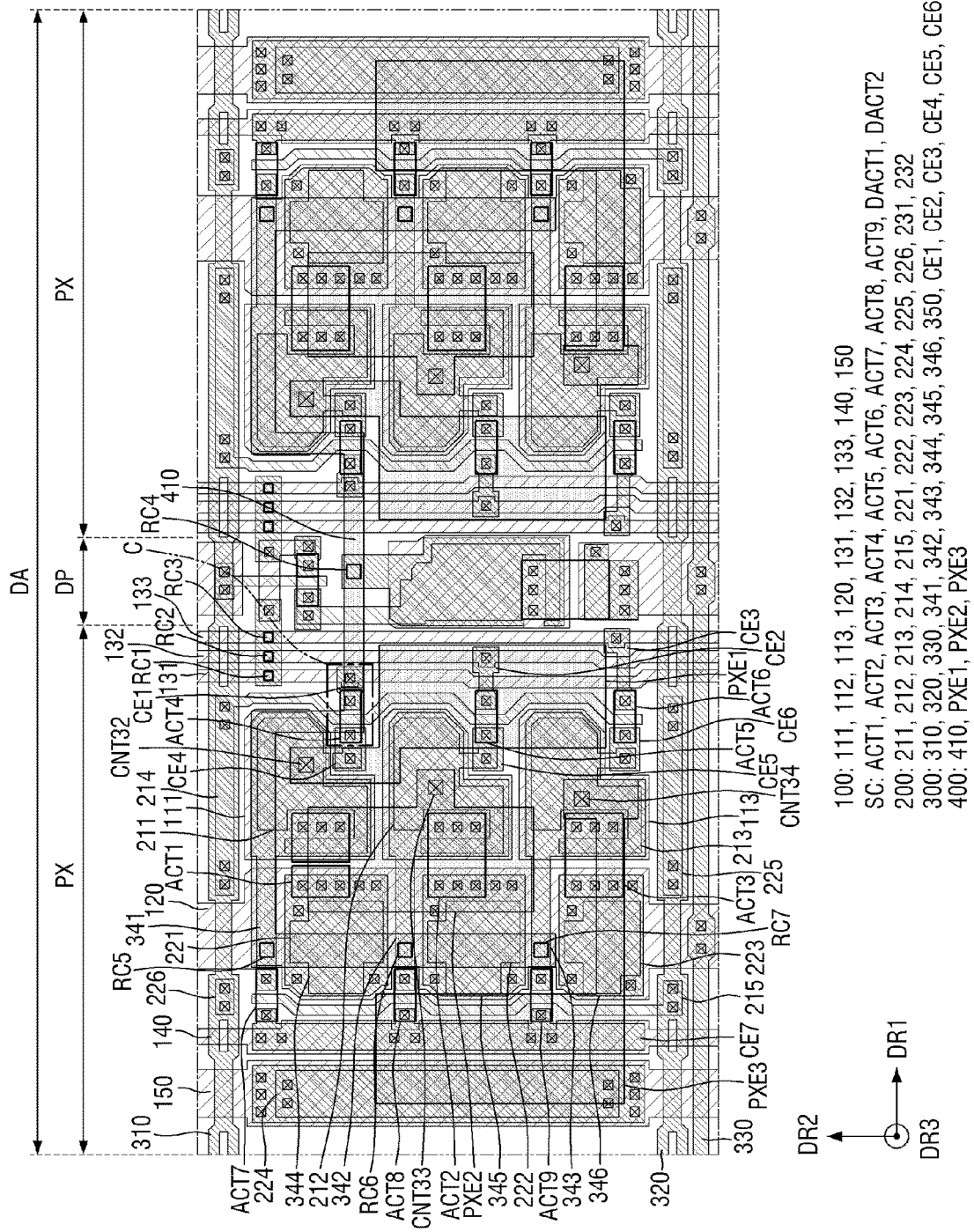
FIG. 19 is a schematic layout view of the pixels and the repair circuit for explaining the method of repairing the display device according to an embodiment.
Figure 20:
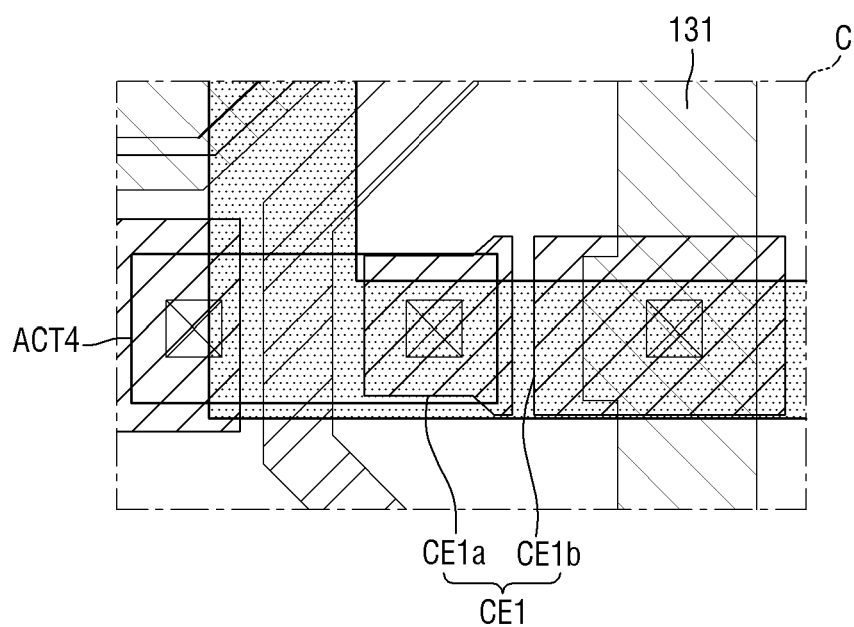
FIG. 20 is an enlarged schematic view of area C of FIG. 19.

FIG. 18 is a schematic diagram of an equivalent circuit of pixels PX and a repair circuit DP for explaining a method of repairing a display device according to an embodiment. FIG. 19 is a schematic layout view of the pixels PX and the repair circuit DP for explaining the method of repairing the display device according to an embodiment. FIG. 20 is an enlarged schematic view of area C of FIG. 19.

Referring to FIGS. 18 through 20, a method of repairing the display device according to a current embodiment may be different from a method according to the embodiments of FIGS. 12 through 17 in that it may be a method of repairing a second transistor T2 in case that the second transistor T2 of any one of subpixels PXS1 through PXS3 is defective. FIGS. 18 through 20 illustrate a method of repairing a defect occurring, for example, in the second transistor T2 of a first subpixel PXS1 of a pixel PX.

Specifically, in case that the second transistor T2 of the first subpixel PXS1 of the pixel PX is defective, the second transistor T2 and a first data line 131 may be additionally cut. Accordingly, a light emitting element EMD of the first subpixel PXS1 may not be affected by the defective second transistor T2 of the first subpixel PXS1. However, the disclosure is not limited thereto. In case that the second transistor T2 and the first data line 131 are cut, the second transistor T2 and a storage capacitor CST (or a gate electrode of a first transistor T1) may not be cut.

A first contact pattern CE1 of the pixel PX may be cut into at least two parts, and the two parts may be separated and electrically isolated from each other. In other words, the first contact pattern CE1 may be cut into at least two parts. The first contact pattern CE1 may be divided into a first area CE1a overlapping a fourth semiconductor pattern ACT4 and a second area CE1b overlapping the first data line 131. The first area CE1a and the second area CE1b may be separated and electrically isolated from each other. Accordingly, the fourth semiconductor pattern ACT4 and the first data line 131 may be electrically isolated from each other.

In a part where the first contact pattern CE1 may be cut into the first area CE1a and the second area CE1b, other elements may not be disposed in plan view. It may be possible to suppress or prevent other elements from being damaged by a laser irradiated to the first contact pattern CE1 in case that the cutting of the first contact pattern CE1 is performed using the laser or the like.

Even in this case, even if the first transistor T1 or the storage capacitor CST may be defective, it can be repaired. In the current embodiment, the second transistor T2, if defective, can be repaired, the yield of non-defective products can be further increased, and the process cost can be further reduced.

Figure 21:
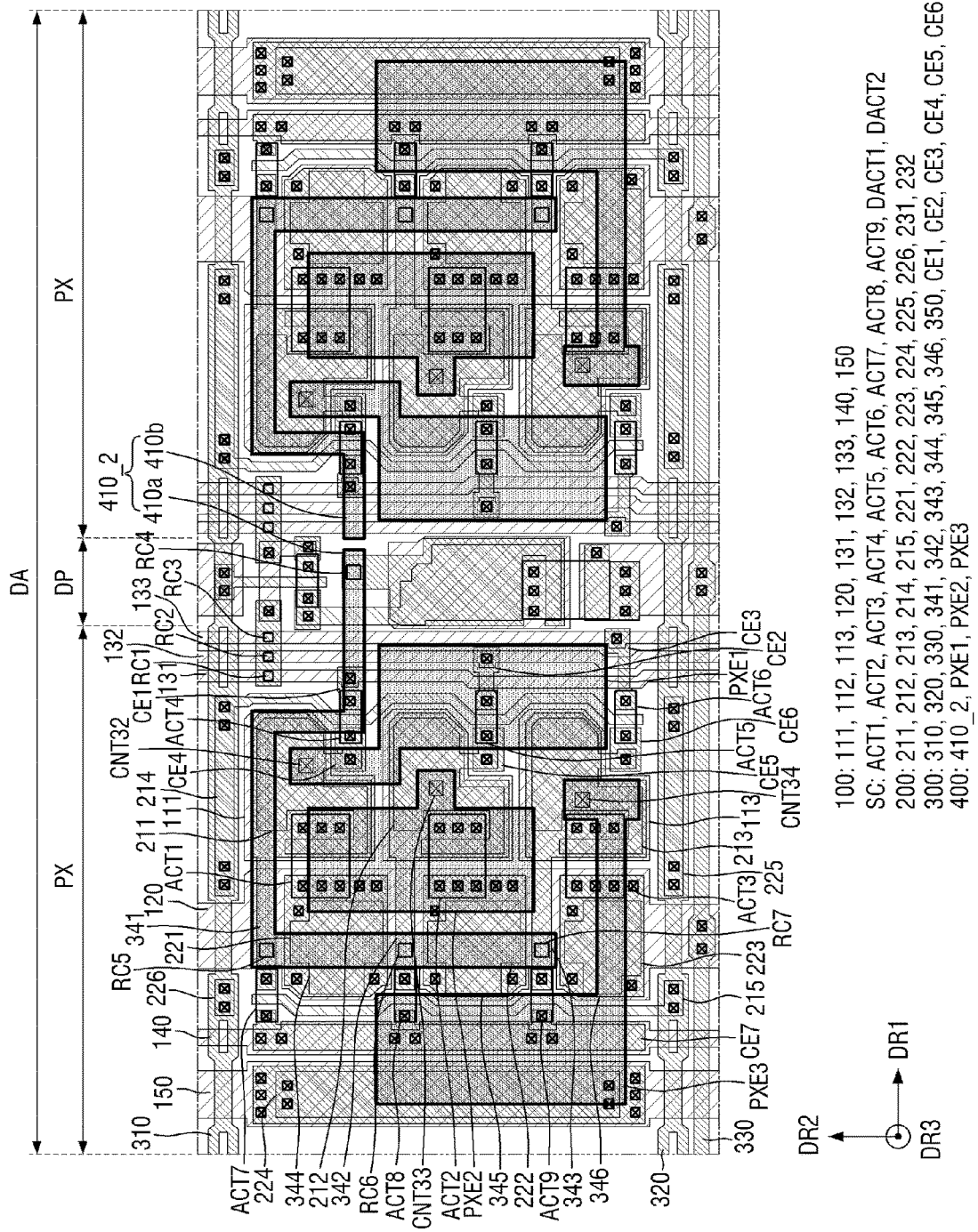
FIG. 21 is a schematic layout view of pixels and a repair circuit for explaining a method of repairing a display device according to an embodiment.

FIG. 21 is a schematic layout view of pixels PX and a repair circuit DP for explaining a method of repairing a display device according to an embodiment.

Referring to FIG. 21, a current embodiment may be different from an embodiment of FIG. 13 in that a repair circuit connection pattern 4102 may be separated into two different parts electrically isolated from each other.

Specifically, in case the repair circuit DP is electrically connected to a light emitting element EMD of a first subpixel PXS1 of a pixel PX disposed on a first side of the repair circuit DP in the first direction DR1, the repair circuit connection pattern 410_2 may include a first area 410a extending from a part overlapping a repair data conductive pattern 350 toward the first side in the first direction DR1 and a second area 410b separated from the first area 410a and disposed on a second side of the first area 410a in the first direction DR1. The first area 410a of the repair circuit connection pattern 410_2 may extend to the pixel PX disposed on the first side of the repair circuit DP in the first direction DR1, and the second area 410b may extend to a pixel PX disposed on a second side of the repair circuit DP in the first direction DR1.

The first area 410a of the repair circuit connection pattern 410_2 may be electrically connected to the repair data conductive pattern 350, but the second area 410b of the repair circuit connection pattern 410_2 may be electrically isolated from the repair data conductive pattern 350. The first area 410a and the second area 410b of the repair circuit connection pattern 4102 may be formed by cutting the integrally formed repair circuit connection pattern 410_2, but the disclosure is not limited thereto.

Even in this case, even if a first transistor T1 or a storage capacitor CST may be defective, it can be repaired. Also, the yield of non-defective products can be increased, and the process cost can be reduced. Since the repair circuit connection pattern 410_2 may be cut, it may be possible to suppress or prevent a pixel PX adjacent to but not electrically connected to the repair circuit DP from being affected by the repair circuit DP. Furthermore, the reliability of each pixel PX of the display device can be improved.

In a display device and a method of repairing the display device according to an embodiment, a defective pixel (or subpixel) can be repaired, thereby improving yield and reducing process cost.

However, the effects of the disclosure are not restricted to the one set forth herein. The above and other effects of the disclosure will become more apparent to one of ordinary skill in the art to which the disclosure pertains by referencing the claims including equivalents thereof.

What is claimed is:

1. A display device comprising:
   at least one pixel including:
      a first subpixel and a second subpixel that emit light of different colors; and
      a power line electrically connected to the first subpixel and the second subpixel and applying a power supply voltage to each of the first subpixel and the second subpixel;
   at least one repair circuit disposed adjacent to the at least one pixel; and
   a first repair circuit connection pattern extending across the at least one pixel and the at least one repair circuit, wherein
   each of the first subpixel and the second subpixel comprises:
      a light emitting element;
      a first transistor electrically connected to the light emitting element; and
      a second transistor electrically connected to a gate electrode of the first transistor,
   the at least one repair circuit comprises:
      a first repair transistor; and
      a second repair transistor electrically connected to a gate electrode of the first repair transistor,
   a first source or drain electrode of the first transistor of each of the first subpixel and the second subpixel is electrically connected to the power line,
   a second source or drain electrode of the first transistor of each of the first subpixel and the second subpixel overlaps the first repair circuit connection pattern,
   a first source or drain electrode of the first repair transistor is electrically connected to the power line, and
   a second source or drain electrode of the first repair transistor overlaps the first repair circuit connection pattern.

2. The display device of claim 1, wherein
   the light emitting element of each of the first subpixel and the second subpixel comprises an anode, a light emitting layer, and a cathode that are stacked sequentially,
   the first source or drain electrode of the first transistor of each of the first subpixel and the second subpixel, the second source or drain electrode of the first transistor of each of the first subpixel and the second subpixel, the first source or drain electrode of the first repair transistor, and the second source or drain electrode of the first repair transistor form a first conductive layer, and
   the first repair circuit connection pattern and the anode of the light emitting element of each of the first subpixel and the second subpixel form a second conductive layer different from the first conductive layer.

3. The display device of claim 2, further comprising a via layer on the first conductive layer,
   wherein the via layer is disposed between the first conductive layer and the second conductive layer.

4. The display device of claim 3, wherein
   the via layer comprises a first recess pattern and a second recess pattern that are defined by removing at least a part of the via layer in a thickness direction, wherein
   the first recess pattern is disposed in an area in which the second source or drain electrode of the first transistor of each of the first subpixel and the second subpixel overlaps the first repair circuit connection pattern, and
   the second recess pattern is disposed in an area in which the second source or drain electrode of the first repair transistor of the at least one repair circuit overlaps the first repair circuit connection pattern.

5. The display device of claim 4, wherein at least a part of the first repair circuit connection pattern is disposed in at least one of the first recess pattern and the second recess pattern.

6. The display device of claim 2, wherein
   the power line forms a third conductive layer different from the first conductive layer and the second conductive layer, and
   the third conductive layer is disposed under the first conductive layer and the second conductive layer.

7. The display device of claim 6, further comprising a fourth conductive layer different from the first conductive layer, the second conductive layer and the third conductive layer,
   wherein the fourth conductive layer comprises:
      gate electrodes of the first transistor and the second transistor of each of the first subpixel and the second subpixel; and
      gate electrodes of the first repair transistor and the second repair transistor.

8. The display device of claim 1, wherein in an area in which the second source or drain electrode of the first transistor of each of the first subpixel and the second subpixel overlaps the first repair circuit connection pattern, at least one insulating layer is at least partially disposed between the second source or drain electrode of the first transistor of each of the first subpixel and the second subpixel and the first repair circuit connection pattern, and the second source or drain electrode of the first transistor of each of the first subpixel and the second subpixel is electrically isolated from the first repair circuit connection pattern.

9. The display device of claim 1, further comprising:
a first data line and a second data line that are adjacent to each other and extend in a same direction; and
a second repair circuit connection pattern extending across the first data line and the second data line and overlapping the first data line and the second data line, wherein
the second transistor of the first subpixel is electrically connected to the first data line,
the second transistor of the second subpixel is electrically connected to the second data line, and
the second repair transistor is electrically connected to the second repair circuit connection pattern.

10. The display device of claim 9, wherein
the first data line, the second data line and the power line form a first conductive layer, and
the second repair circuit connection pattern, the first source or drain electrode of the first transistor of each of the first subpixel and the second subpixel, the second source or drain electrode of the first transistor of the first transistor of each of the first subpixel and the second subpixel, the first source or drain electrode of the first repair transistor, and the second source or drain electrode of the first repair transistor form a second conductive layer different from the first conductive layer.

11. The display device of claim 10, further comprising an insulating layer between the first conductive layer and the second conductive layer, the insulating layer including a first recess pattern and a second recess pattern that are defined by removing at least a part of the insulating layer, wherein
the first recess pattern is disposed in an area in which the second repair circuit connection pattern overlaps the first data line, and
the second recess pattern is disposed in an area in which the second repair circuit connection pattern overlaps the second data line.

12. The display device of claim 11, wherein the insulating layer comprises a buffer layer and an interlayer insulating layer that are stacked sequentially.

13. The display device of claim 1, wherein
the at least one pixel is provided in plural,
the at least one repair circuit is provided in plural,
each of the plurality of repair circuits is disposed between adjacent ones of the plurality of pixels, and
the adjacent ones of the plurality of pixels are symmetrical to each other.

14. The display device of claim 13, further comprising a display area displaying an image and a non-display area disposed adjacent to the display area,
wherein the plurality of pixels and the plurality of repair circuits are disposed in the display area.

15. A display device comprising:
a pixel including:
a first subpixel and a second subpixel that emit light of different colors; and
a power line electrically connected to at least one of the first subpixel and the second subpixel;
a repair circuit disposed adjacent to the pixel and comprising:
a first repair transistor; and
a second repair transistor electrically connected to a gate electrode of the first repair transistor; and
a first repair circuit connection pattern extending across the pixel and the repair circuit, wherein
the first subpixel includes:
a first transistor electrically connected to a first light emitting element; and
a second transistor electrically connected to a gate electrode of the first transistor,
the second subpixel includes a second light emitting element different from the first light emitting element,
a first source or drain electrode of the first transistor of the first subpixel is electrically connected to the power line,
a second source or drain electrode of the first transistor of the first subpixel overlaps and is electrically isolated from the first repair circuit connection pattern,
a first source or drain electrode of the first repair transistor is electrically connected to the power line,
a second source or drain electrode of the first repair transistor overlaps the first repair circuit connection pattern, and
the second source or drain electrode of the first repair transistor is electrically connected to the first repair circuit connection pattern in an area overlapping the first repair circuit connection pattern.

16. The display device of claim 15, wherein
each of the first light emitting element and the second light emitting element comprises an anode, a light emitting layer, and a cathode that are stacked sequentially,
the first source or drain electrode and the second source or drain electrode of the first transistor and the first source or drain electrode and the second source or drain electrode of the first repair transistor form a first conductive layer, and
the first repair circuit connection pattern and the anode of each of the first light emitting element and the second light emitting element form a second conductive layer different from the first conductive layer.

17. The display device of claim 15, further comprising:
a first data line and a second data line that are adjacent to each other and extend in a same direction; and
a second repair circuit connection pattern overlapping the first data line and the second data line and electrically connected to the second repair transistor,
wherein the second repair circuit connection pattern is electrically isolated from the first data line and is electrically connected to the second data line in an area overlapping the second data line.

18. The display device of claim 17, wherein
the first data line, the second data line and the power line form a first conductive layer,
the second repair circuit connection pattern, the first source or drain electrode and the second source or drain electrode of the first transistor, the first source or drain electrode and the second source or drain electrode of the first repair transistor, and a first source or drain electrode and a second source or drain electrode of the second repair transistor form a second conductive layer different from the first conductive layer.

19. The display device of claim 15, wherein in an area in which the first repair circuit connection pattern overlaps the second source or drain electrode of the first repair transistor, the second source or drain electrode of the first repair transistor is electrically connected to the first repair circuit connection pattern by welding.

20. The display device of claim 15, wherein the second subpixel further comprises a first transistor electrically connected to the second light emitting element and electrically isolated from the power line.

* * * * *